US012783761B2

(12) United States Patent
Schumacher et al.

(10) Patent No.: US 12,783,761 B2
(45) Date of Patent: Nov. 3, 2026

(54) HARDWARE EVENT TRACE WINDOWING FOR A DATA PROCESSING ARRAY

(71) Applicant: Xilinx, Inc., San Jose, CA (US)

(72) Inventors: Paul Robert Schumacher, Berthoud, CO (US); Anurag Dubey, Boulder, CO (US); Jason Richard Villarreal, Los Gatos, CA (US); Roger Ng, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 717 days.

(21) Appl. No.: 18/313,945

(22) Filed: May 8, 2023

(65) Prior Publication Data

US 2024/0378358 A1 Nov. 14, 2024

(51) Int. Cl.
*G06F 30/31* (2020.01)

(52) U.S. Cl.
CPC .................................... *G06F 30/31* (2020.01)

(58) Field of Classification Search
CPC ........ G06F 30/31; G06F 30/20; G06F 9/3881; G06F 9/3836; G06F 9/3004; G06F 11/3636; G06F 21/62; G06F 30/331; G06F 30/34; G06F 30/398; G06F 9/4411; G06F 9/44505; G06F 9/5044; G06F 9/505; G06F 9/264; G06F 9/30072; G06F 9/30145; G06F 9/3842; G06F 9/5083; G06F 21/10; G06F 21/44; G06F 9/451
USPC .................................................. 716/100–106
See application file for complete search history.

(56) References Cited

U.S. PATENT DOCUMENTS

| | | | | |
|---|---|---|---|---|
| 7,490,227 | B1 | 2/2009 | Bilski et al. | |
| 8,042,007 | B1 | 10/2011 | Chan et al. | |
| 8,117,577 | B1 | 2/2012 | Vadi et al. | |
| 8,415,974 | B1 | 4/2013 | Lysaght | |
| 9,678,852 | B2 | 6/2017 | Horley | |
| 10,326,448 | B2 * | 6/2019 | Vassiliev | H04L 47/10 |
| 10,346,572 | B1 | 7/2019 | Corbett et al. | |
| 10,474,610 | B1 | 11/2019 | Schelle et al. | |
| 10,740,210 | B1 * | 8/2020 | Schumacher | G06F 8/452 |
| 2008/0244327 | A1 | 10/2008 | Coombes | |
| 2008/0320268 | A1 | 12/2008 | Wingard | |
| 2010/0095152 | A1 | 4/2010 | Darrington | |
| 2018/0150299 | A1 | 5/2018 | Balle | |
| 2019/0102224 | A1 | 4/2019 | Bernat | |
| 2019/0303311 | A1 * | 10/2019 | Bilski | G06F 13/1657 |
| 2019/0317802 | A1 | 10/2019 | Bachmutsky | |
| 2022/0027278 | A1 | 1/2022 | Wysocki | |
| 2024/0354223 | A1 | 10/2024 | Schumacher et al. | |
| 2024/0378062 | A1 | 11/2024 | Mysore et al. | |

* cited by examiner

*Primary Examiner* — Binh C Tat
(74) *Attorney, Agent, or Firm* — Kevin T. Cuenot

(57) ABSTRACT

Hardware event trace windowing for a data processing array includes executing a user design using a plurality of active tiles of a data processing array disposed in an integrated circuit. A trace start condition is detected subsequent to a start of execution of the user design. In response to the trace start condition, trace data is generated using one or more of the plurality of active tiles of the data processing array. A trace stop condition is detected during execution of the user design. In response to the trace stop condition, the generating the trace data by the one or more of the plurality of active tiles is discontinued.

20 Claims, 20 Drawing Sheets

HARDWARE EVENT TRACE WINDOWING FOR A DATA PROCESSING ARRAY

TECHNICAL FIELD

This disclosure relates to integrated circuits (ICs) and, more particularly, to hardware event trace windowing for ICs that include a data processing array.

BACKGROUND

Modern integrated circuits (ICs) include a variety of different types of compute circuits. Examples of compute circuits that may be included in a single IC include, but are not limited to, one or more processors configured to execute program code, one or more dedicated and hardened circuit blocks configured to perform particular tasks, one or more user-specified circuits implemented in programmable circuitry (e.g., programmable logic), a data processing (DP) array, a graphics processing unit (GPU), or the like. In developing a design for an IC, it is often necessary to collect trace data from the compute circuits to ensure that the design is operating as intended and/or to debug the design.

There are a variety of different challenges for performing trace with certain types of compute circuits. One challenge is managing the large amount of trace data that may be generated. A DP array, for example, is capable of operating at a high clock rate. Further, as each of the plurality of different tiles within the DP array is capable of generating trace data, the DP array, in executing a user design, may generate a significant amount of trace data in a brief period of time. Since user designs may execute for extended periods of time and for multiple iterations, there may not be sufficient memory and/or bandwidth available to store the trace data that is generated.

SUMMARY

In one or more example implementations, a method includes executing a user design using a plurality of active tiles of a data processing array disposed in an integrated circuit. The method includes detecting a trace start condition subsequent to a start of execution of the user design. The method includes, in response to the trace start condition, generating trace data using one or more of the plurality of active tiles of the data processing array. The method includes detecting a trace stop condition during execution of the user design. The method includes, in response to the trace stop condition, discontinuing the generating the trace data by the one or more of the plurality of active tiles.

The foregoing and other implementations can each optionally include one or more of the following features, alone or in combination. Some example implementations include all the following features in combination.

In some aspects, at least one of the trace start condition or the trace stop condition is broadcast from a first tile of the plurality of active tiles to a second tile of the plurality of active tiles. The trace start condition or the trace stop condition, as received by the second tile, controls trace functionality in the second tile.

In some aspects, at least one of the trace start condition or the trace stop condition is broadcast from a first portion of a first tile of the plurality of active tiles to a second portion of the first tile. The trace start condition or the trace stop condition, as received by the second portion of the first tile, controls trace functionality in the second portion of the first tile.

In some aspects, two or more active tiles of the plurality of active tiles use at least one of a different trace start condition or a different trace stop condition. In this sense, the two or more active tiles may be individually configurable to perform trace (e.g., to start trace and/or stop trace at different times).

In some aspects, at least one of the trace start condition or the trace stop condition is specified by a user as a time after a start of execution of the user design. For example, the trace start condition and/or the trace stop condition may be specified by a user in clock cycles or specified by a user in regular time (e.g., seconds) that is translated into clock cycles.

In some aspects, at least one of the trace start condition or the trace stop condition is specified by a user as a number of execution iterations of a graph of the user design.

In some aspects, at least one of the trace start condition or the trace stop condition is specified by a user as a user-event inserted into program code of the user design.

In some aspects, at least one of the trace start condition or the trace stop condition is specified by a user as a hardware event.

In some aspects, the method includes incrementing a first counter of a plurality of counters in the one or more active tiles in response to clock cycles of the data processing array, incrementing a second counter of the plurality of counters in response to the first counter reaching a predetermined first counter value, and detecting at least one of the trace start condition or the trace stop condition in response to the second counter reaching a predetermined second counter value.

In some aspects, at least one of the trace start condition or the trace stop condition is specified on a per graph basis or a per tile basis.

In some aspects, the method includes receiving the trace data in a data processing system, delaying rendering of the trace data until a return of a function of the user design is detected, and using the function that returned as a starting context of a trace report of the trace data.

In one or more example implementations, a system includes an integrated circuit having a data processing array. The data processing array includes a plurality of active tiles configured to execute a user design. Each active tile of the plurality of active tiles includes trace circuitry. The trace circuitry of one or more of the plurality of active tiles is configured to perform trace operations. The trace operations include detecting a trace start condition subsequent to a start of execution of the user design. The trace operations include, in response to the trace start condition, generating trace data using one or more of the plurality of active tiles of the data processing array. The trace operations include detecting a trace stop condition during the execution of the user design. The trace operations include, in response to the trace stop condition, discontinuing the generating the trace data by the one or more of the plurality of active tiles.

The foregoing and other implementations can each optionally include one or more of the following features, alone or in combination. Some example implementations include all the following features in combination.

In some aspects, at least one of the trace start condition or the trace stop condition is broadcast from a first tile of the plurality of active tiles to a second tile of the plurality of active tiles. The trace start condition or the trace stop condition, as received by the second tile, controls trace functionality in the second tile.

In some aspects, at least one of the trace start condition or the trace stop condition is broadcast from a first portion of a first tile of the plurality of active tiles to a second portion of the first tile. The trace start condition or the trace stop condition, as received by the second portion of the first tile, controls trace functionality in the second portion of the first tile.

In some aspects, two or more active tiles of the plurality of active tiles use at least one of a different trace start condition or a different trace stop condition.

In some aspects, at least one of the trace start condition or the trace stop condition is specified by a user as a time after a start of execution of the user design. For example, the trace start condition and/or the trace stop condition may be specified by a user in clock cycles or specified by a user in regular time (e.g., seconds) that is translated into clock cycles.

In some aspects, at least one of the trace start condition or the trace stop condition is specified by a user as a number of execution iterations of a graph of the user design.

In some aspects, at least one of the trace start condition or the trace stop condition is specified by a user as a user-event inserted into program code of the user design.

In some aspects, at least one of the trace start condition or the trace stop condition is specified by a user as a hardware event.

In some aspects, the trace circuitry of the one or more active tiles of the plurality of active tiles includes a plurality of counters including a first counter and a second counter. The first counter is configured to increment in response to clock cycles of the data processing array. The second counter is configured to increment in response to the first counter reaching a predetermined first counter value. At least one of the trace start condition or the trace stop condition is detected in response to the second counter reaching a predetermined second counter value.

In some aspects, the techniques described herein relate to an integrated circuit, wherein at least one of the trace start condition or the trace stop condition is specified on a per graph basis.

In some aspects, the system includes a data processing system coupled to the integrated circuit. The data processing system includes a processor configured to initiate operations including receiving the trace data from the integrated circuit, delaying rendering of the trace data until a return of a function of the user design is detected, and using the function that returned as a starting context of a trace report of the trace data.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
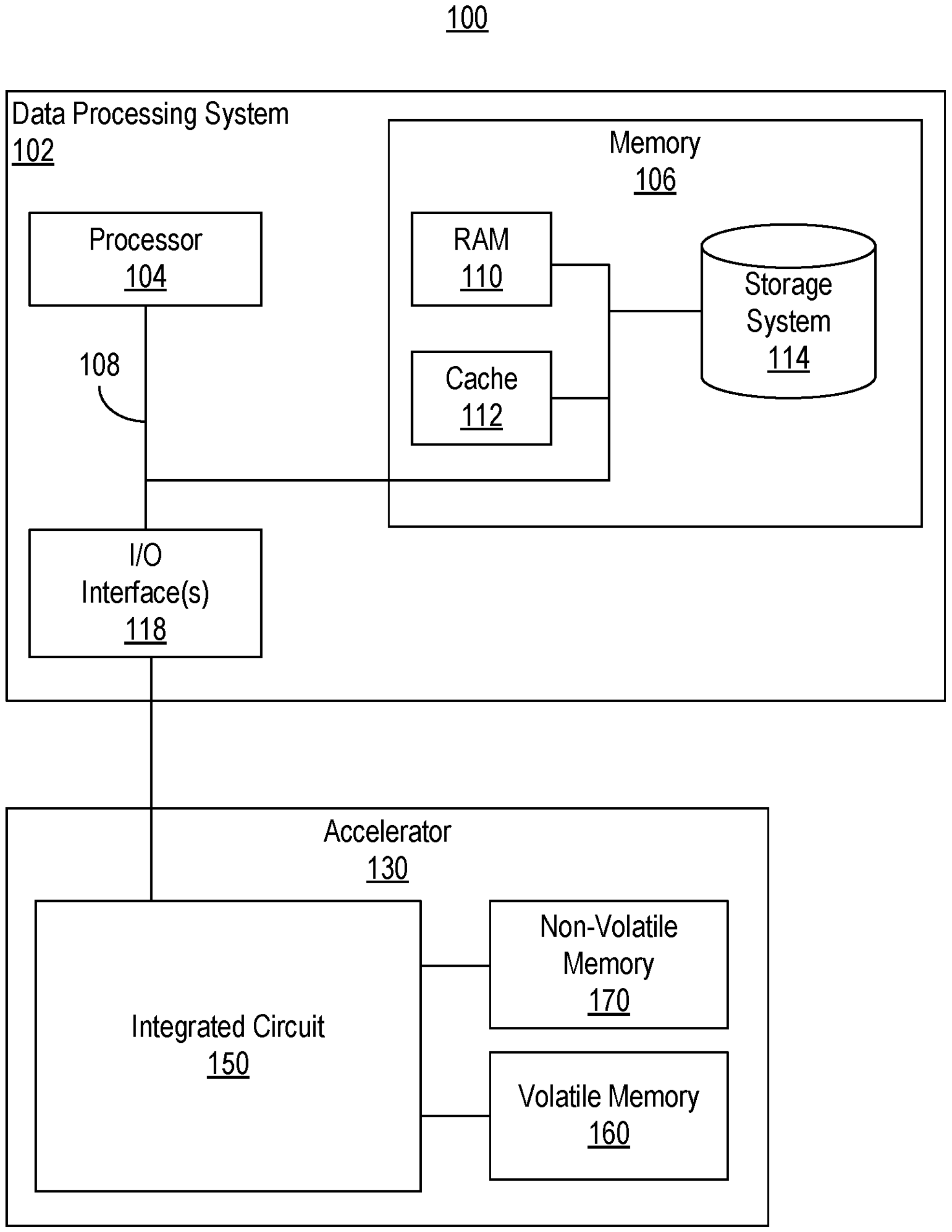
FIG. 1 illustrates an example system including a data processing system and an accelerator for use with the inventive arrangements described herein.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to hardware event trace windowing for ICs that include a data processing array. Windowing refers to the ability to capture trace data for a selected period, e.g., for a particular "window" of time. In accordance with the inventive arrangements described within this disclosure, trace functionality for a hardware resource may be windowed by controlling the starting and/or stopping conditions of the trace functionality. The starting and/or stopping conditions may be set in accordance with user-specified trace criteria. The hardware resources for which trace may be controlled can include various types of compute circuits included in the IC. In one example, the compute circuits may be a data processing (DP) array and/or particular tiles of the DP array.

The trace criteria define the window during which trace data, formed of hardware events, is captured. The trace criteria include a trace start condition and/or a trace stop condition. In response to detecting a trace start condition, trace may be started. In response to detecting a trace stop condition, trace may be stopped. Within the DP array, trace functionality may be controlled on a per-tile basis independently, on a per graph basis independently, and/or a per kernel basis independently. The trace start conditions and/or trace stop conditions may be specified as any of a variety of user-specifiable options. Examples of these options can include, but are not limited to, time, number of iterations of a particular design or portion of a design, user-events inserted into kernels of the user design, and/or by detecting particular hardware events that occur within the compute circuit(s).

Further aspects of the inventive arrangements are described below with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example system 100 including a data processing system (e.g., a host data processing system) 102 and an accelerator 130 for use with the inventive arrangements. Data processing system 102 is an example of a computer that is capable of performing a design flow, trace, and/or trace analysis functions described herein. It should be appreciated that any of a variety of data processing systems may implement the various functions described herein that are attributable to a computer and that in some examples different computers may perform different operations as described. For example, one computer may perform a design flow while another performs trace analysis. For certain operations such as those of a design flow, accelerator 130 does not need to be coupled to the data processing system. Further, data processing system 102 is capable of executing suitable program code to communicate with IC 150 on accelerator 130. In the example, data processing system 102 includes a processor 104 (e.g., a host processor), a memory 106, and a bus 108 that couples various system components including memory 106 to processor 104.

Processor 104 may be implemented as one or more hardware circuits, e.g., integrated circuits, capable of carrying out instructions contained in program code. In an example, processor 104 is implemented as a central processing unit (CPU). Processor 104 may be implemented using a complex instruction set computer architecture (CISC), a reduced instruction set computer architecture (RISC), a vector processing architecture, or other known architectures. Example processors include, but are not limited to, processors having an x86 type of architecture (IA-32, IA-64, etc.), Power Architecture, ARM processors, and the like.

Bus 108 represents one or more of any of a variety of communication bus structures. By way of example, and not limitation, bus 108 may be implemented as a Peripheral Component Interconnect Express (PCIe) bus. Data processing system 102 typically includes a variety of computer system readable media. Such media may include computer-readable volatile and non-volatile media and computer-readable removable and non-removable media.

Memory 106 can include computer-readable media in the form of volatile memory, such as RAM 110 and/or cache memory 112. Data processing system 102 also can include other removable/non-removable, volatile/non-volatile computer storage media. For example, storage system 114 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be included in storage system 114. In such instances, each can be connected to bus 108 by one or more data media interfaces also included in storage system 114. Memory 106 is an example of at least one computer program product.

Memory 106 is capable of storing computer-readable program instructions that are executable by processor 104. For example, the computer-readable program instructions can include an operating system, one or more application programs, other program code, and program data. Processor 104, in executing the computer-readable program instructions, is capable of performing the various operations described herein that are attributable to a computer. It should be appreciated that data items used, generated, and/or operated upon by data processing system 102 are functional data structures that impart functionality when employed by data processing system 102.

As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor.

Data processing system 102 may include one or more Input/Output (I/O) interfaces 118 communicatively linked to bus 108. I/O interface(s) 118 allow data processing system 102 to communicate with one or more external devices such as accelerator 130. Examples of I/O interfaces 118 may include, but are not limited to, network cards, modems, network adapters, hardware controllers, etc. Examples of external devices also may include devices that allow a user to interact with data processing system 102 (e.g., a display, a keyboard, and/or a pointing device).

Data processing system 102 is only one example implementation. Data processing system 102 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices.

In an example implementation, I/O interface 118 may be implemented as a PCIe adapter. Data processing system 102 and accelerator 130 communicate over a communication channel, e.g., a PCIe communication channel. Accelerator 130 may be implemented as a circuit board that couples to data processing system 102. Accelerator 130 may, for example, be inserted into a card slot, e.g., an available bus and/or PCIe slot, of data processing system 102. In one aspect, accelerator 130 may be considered a peripheral device of data processing system 102.

In one or more other aspects, data processing system 102 may be coupled to IC 150 by way of a different physical connection such as a Joint Test Action Group (JTAG) connection, a serial connection, or an Ethernet connection. In that case, data processing system 102 may communicate with IC 150 via the physical connection and accelerator 130 may not be considered a peripheral device of data processing system 102.

Accelerator 130 may include IC 150. Accelerator 130 also may include a volatile memory 160 coupled to IC 150 and a non-volatile memory 170 also coupled to IC 150. Volatile memory 160 may be implemented as a RAM. Non-volatile memory 170 may be implemented as flash memory.

Figure 2:
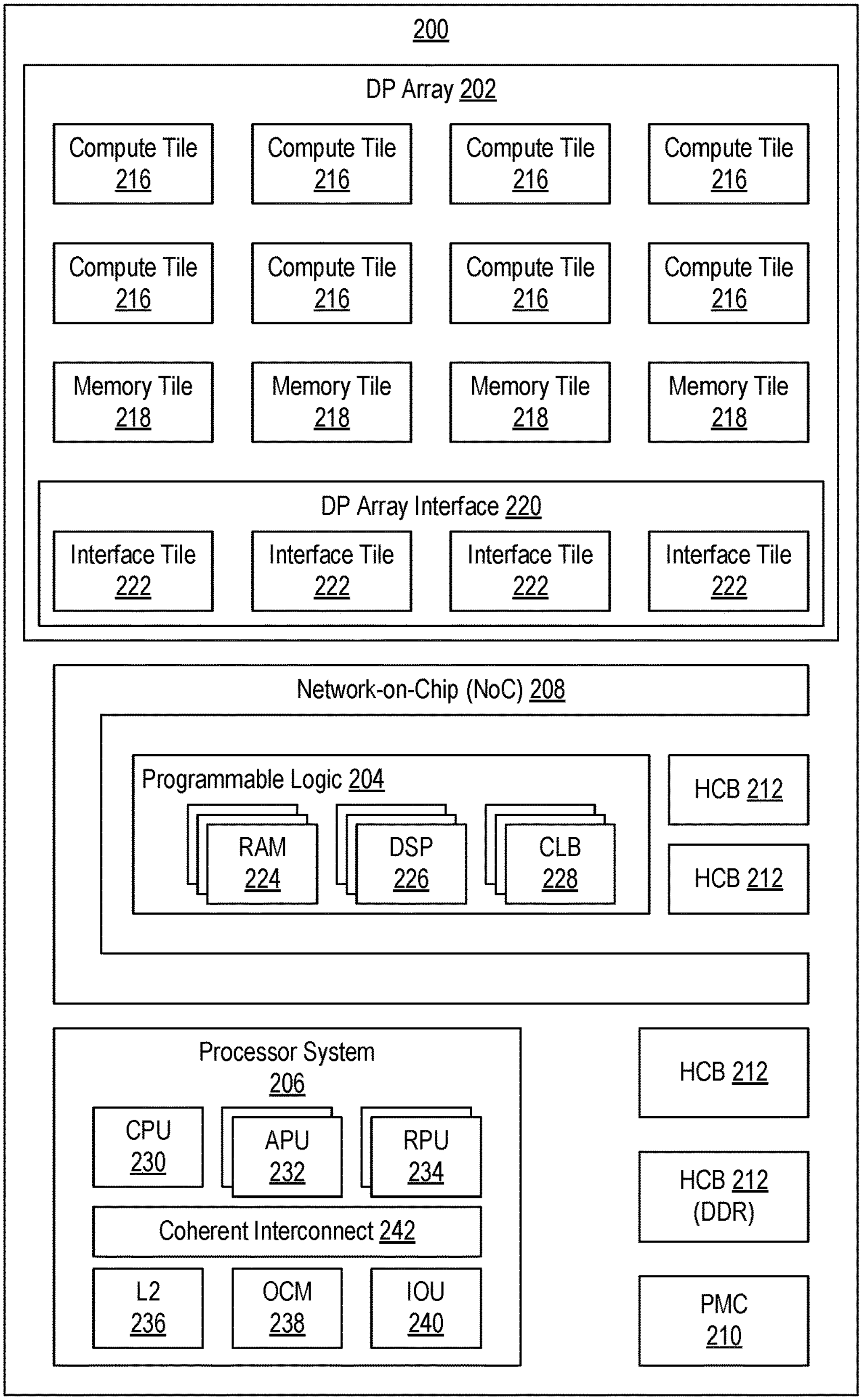
FIG. 2 illustrates an example architecture for an integrated circuit.

FIG. 2 illustrates an example architecture 200 for an IC. Architecture 200 may be used to implement IC 150 of FIG. 1, for example. Architecture 200 may be used to implement a variety of different types of ICs including, but not limited to, a programmable IC, an adaptive system, and/or a System-on-Chip (SoC). In the example of FIG. 2, architecture 200 is implemented on a single die provided within a single package. In other examples, architecture 200 may be implemented using a plurality of interconnected dies within a single package where the various resources of architecture 200 (e.g., circuits) illustrated in FIG. 2 are implemented across the different interconnected dies.

In the example, architecture 200 includes a plurality of different subsystems including a DP array 202, programmable logic (PL) 204, a processor system (PS) 206, a Network-on-Chip (NoC) 208, a platform management controller (PMC) 210, and one or more hardwired circuit blocks (HCBs) 212.

DP array 202 is implemented as a plurality of interconnected and programmable tiles. The term "tile," as used herein, means a block or portion of circuitry also referred to as a "circuit block." As illustrated, DP array 202 includes a plurality of compute tiles 216 organized in an array and optionally a plurality of memory tiles 218. DP array 202 also includes a DP array interface 220 having a plurality of interface tiles 222.

In the example, compute tiles 216, memory tiles 218, and interface tiles 222 are arranged in an array (e.g., a grid) and are hardwired. Each compute tile 216 can include one or more processors (e.g., cores) and a memory (e.g., a RAM). Each memory tile 218 may include a memory (e.g., a RAM). In one example implementation, cores of compute tiles 216 may be implemented as custom circuits that do not execute program code. In another example implementation, cores of compute tiles 216 are capable of executing program code stored in core-specific program memories contained within each respective processor.

Figure 3A:
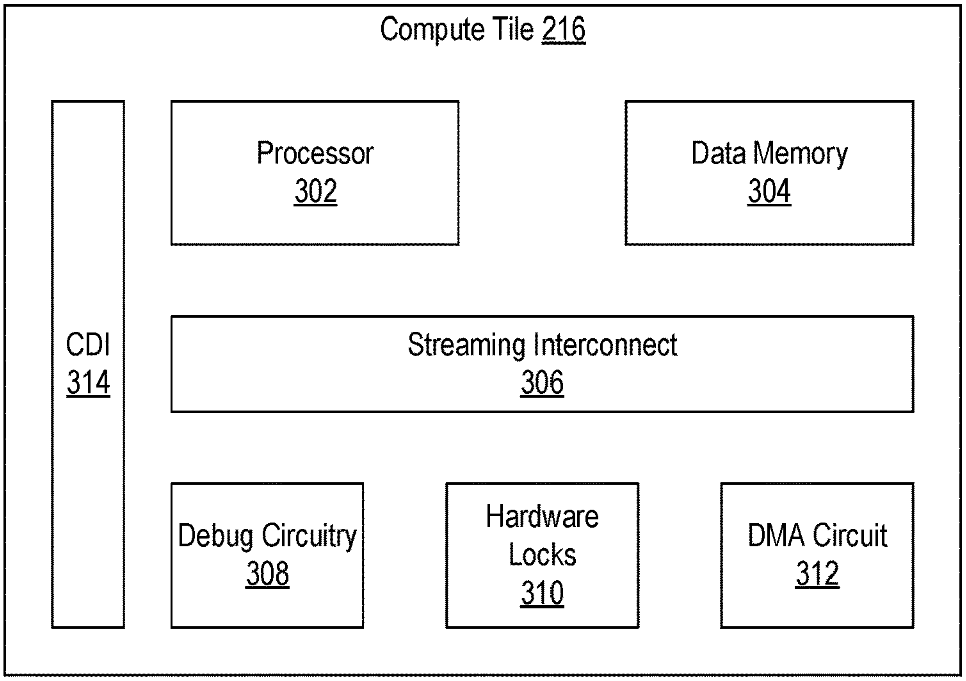
FIGS. 3A, 3B, and 3C illustrate example implementations of tiles of a data processing array.

FIG. 3A illustrates an example implementation of a compute tile 216. In the example, compute tile 216 includes a processor 302, a data memory 304, a streaming interconnect 306, debug circuitry 308, hardware locks 310, a direct memory access (DMA) circuit 312, and a configuration and debug interface (CDI) 314. Within this disclosure, DMA circuits are examples of data movers. Processor 302 may be implemented with a Very-Long Instruction Word architecture. In one or more examples, processor 302 may be implemented as a vector processor capable of performing both fixed and floating-point operations and/or a scalar processor. Data memory 304 may be implemented as a RAM. Processor 302 is capable of directly accessing the data memory 304 in the same compute tile and in other adjacent compute tiles 216. Processor 302 also has direct connections to other processors 302 in adjacent compute tiles 216 so that data may be conveyed directly between processors 302 without writing such data to a data memory 304 (e.g., without using shared memory to communicate data) and/or without conveying data over a streaming interconnect 306.

Streaming interconnect 306 provides dedicated multi-bit data movement channels connecting to streaming interconnects 306 in each adjacent tile in the north, east, west, and south directions of DP array 202. DMA circuit 312 is coupled to streaming interconnect 306 and is capable of performing DMA operations to move data in to and out from data memory 304 by way of streaming interconnect 306. Hardware locks 310 facilitate the safe transfer of data to/from data memory 304 and other adjacent and/or non-adjacent tiles. CDI 314 may be implemented as a memory mapped interface providing read and write access to any memory location within compute tile 216. Compute tile 216 may include other circuit blocks not illustrated in the general example of FIG. 3A.

Figure 3B:
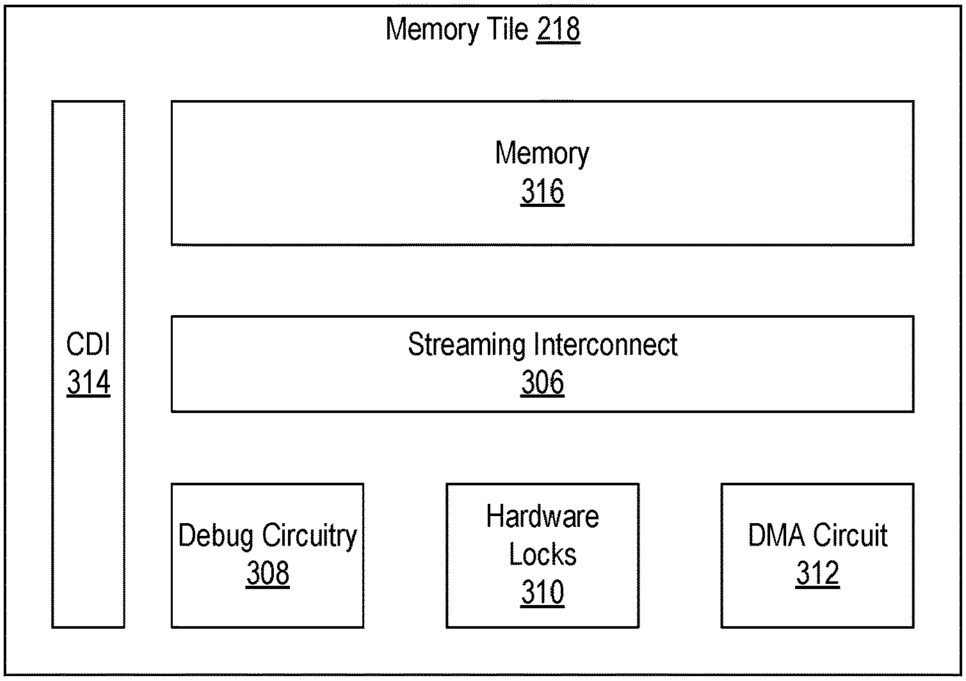

FIG. 3B illustrates an example implementation of a memory tile 218. In the example, memory tile 218 includes a memory 316, a streaming interconnect 306, debug circuitry 308, hardware locks 310, a DMA circuit 312, and a CDI 314. Memory 316 may have a larger capacity than data memory 304. DMA circuit 312 of each memory tile 218 may access the memory 316 within the same tile as well as the memory 316 of one or more adjacent memory tiles. In general, memory tile 218 is characterized by the lack of a processor and the inability to execute program code. Each memory tile 218 may be read and/or written by any of compute tiles 216 and/or interface tiles 222 by way of interconnected streaming interconnects 306. Memory tile 218 may include other circuit blocks not illustrated in the general example of FIG. 3B.

DP array interface 220 connects compute tiles 216 and/or memory tiles 218 to other resources of architecture 200. As illustrated, DP array interface 220 includes a plurality of interconnected interface tiles 222 organized in a row. In one example, each interface tile 222 may have a same architecture. In another example, interface tiles 222 may be implemented with different architectures where each different interface tile architecture supports communication with a different type of resource (e.g., subsystem) of architecture 200. Interface tiles 222 of DP array interface 220 are connected so that data may be propagated from one interface tile to another bi-directionally. Each interface tile 222 is capable of operating as an interface for the column of compute tiles 216 and/or memory tiles 218 directly above.

Figure 3C:
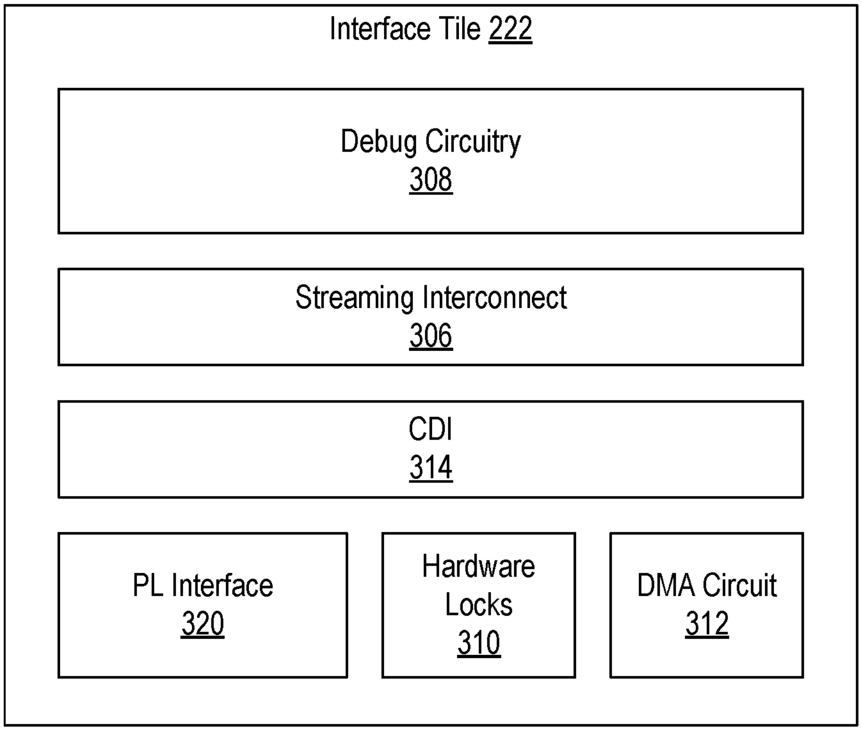

FIG. 3C illustrates an example implementation of an interface tile 222. In the example, interface tile 222 includes a PL interface 320, a streaming interconnect 306, debug circuitry 308, hardware locks 310, a DMA circuit 312, and a CDI 314. Interface tile 222 may include other circuit blocks not illustrated in the general example of FIG. 3C. The example interface tile 222 of FIG. 3C is capable of communicating with the PL 204 via PL interface 320 and NoC 208 via DMA circuit 312. Other example architectures for interface tile 222 may omit interface 320 or omit DMA circuit 312.

PL 204 is circuitry that may be programmed to perform specified functions. As an example, PL 204 may be implemented as field programmable gate array type of circuitry. PL 204 can include an array of programmable circuit blocks. The programmable circuit blocks may include, but are not limited to, RAMs 224 (e.g., block RAMs of varying size), digital signal processing (DSP) blocks 226 capable of performing various multiplication operations, and/or configurable logic blocks (CLBs) 228 each including one or more flip-flops and a lookup table. As defined herein, the term "programmable logic" means circuitry used to build reconfigurable digital circuits. The topology of PL 204 is highly configurable unlike hardwired circuitry. Connectivity among the circuit blocks of PL 204 may be specified on a per-bit basis while the tiles of DP array 202 are connected by multi-bit data paths (e.g., streams) capable of packet-based communication.

PS 206 is implemented as hardwired circuitry that is fabricated as part of architecture 200. PS 206 may be implemented as, or include, any of a variety of different processor types each capable of executing program code. For example, PS 206 may include a central processing unit (CPU) 230, one or more application processing units (APUs) 232, one or more real-time processing units (RPUs) 234, a level 2 (L2) cache 236, an on-chip memory (OCM) 238, an Input/Output Unit (IOU) 240, each interconnected by a coherent interconnect 242. The example CPU and/or processing units of PS 206 may be implemented using any of a variety of different types of architectures. Example architectures that may be used to implement processing units of PS 206 may include, but are not limited to, an ARM processor architecture, an x86 processor architecture, a graphics processing unit (GPU) architecture, a mobile processor architecture, a DSP architecture, combinations of the foregoing architectures, or other suitable architecture that is capable of executing computer-readable instructions or program code.

NoC 208 is a programmable interconnecting network for sharing data between endpoint circuits in architecture 200. NoC 208 may be implemented as a packet-switched network. The endpoint circuits can be disposed in DP array 202, PL 204, PS 206, and/or selected HCBs 212. NoC 208 can include high-speed data paths with dedicated switching. In an example, NoC 208 includes one or more horizontal paths, one or more vertical paths, or both horizontal and vertical path(s). NoC 208 is an example of the common infrastructure that is available within architecture 200 to connect selected components and/or subsystems.

Being programmable, nets that are to be routed through NoC 208 may be unknown until a design is created and routed for implementation within architecture 200. NoC 208 may be programmed by loading configuration data into internal configuration registers that define how elements within NoC 208 such as switches and interfaces are configured and operate to pass data from switch to switch and among the NoC interfaces to connect the endpoint circuits. NoC 208 is fabricated as part of architecture 200 (e.g., is hardwired) and, while not physically modifiable, may be programmed to establish logical connectivity between different master circuits and different slave circuits of a user circuit design.

PMC 210 is a subsystem within architecture 200 that is capable of managing the other programmable circuit resources (e.g., subsystems) across the entirety of architecture 200. PMC 210 is capable of maintaining a safe and secure environment, booting architecture 200, and managing architecture 200 during normal operations. For example, PMC 210 is capable of providing unified and programmable control over power-up, boot/configuration, security, power management, safety monitoring, debugging, and/or error handling for the different subsystems of architecture 200 (e.g., DP array 202, PL 204, PS 206, NoC 208, and/or HCBs 212). PMC 210 operates as a dedicated platform manager that decouples PS 206 and from PL 204. As such, PS 206 and PL 204 may be managed, configured, and/or powered on and/or off independently of one another.

HCBs 212 are special-purpose or application specific circuit blocks fabricated as part of architecture 200. Though hardwired, HCBs 212 may be configured by loading configuration data into control registers to implement one or more different modes of operation. Examples of HCBs 212 may include input/output (I/O) blocks (e.g., single-ended and pseudo differential I/Os), transceivers for sending and receiving signals to circuits and/or systems external to architecture 200 (e.g., high-speed differentially clocked transceivers), memory controllers, cryptographic engines, digital-to-analog converters (DACs), analog-to-digital converters (ADCs), and the like. In another aspect, one or more HCBs 212 may implement a RAM.

The various programmable circuit resources illustrated in FIG. 2 may be programmed initially as part of a boot process. During runtime, the programmable circuit resources may be reconfigured. In one aspect, PMC 210 is capable of initially configuring DP array 202, PL 204, PS 206, and NoC 208 to implement a user design. At any point during runtime, PMC 210 may reconfigure all or a portion of architecture 200. In some cases, PS 206 may configure and/or reconfigure PL 204 and/or NoC 208 once initially configured by PMC 210. In some examples, PMC 210 is omitted, in which case PS 206 may perform operations attributable to PMC 210.

Architecture 200 is provided as an example. Other example architectures for an IC may omit certain subsystems described herein and/or include additional subsystems not described herein. Further, the particular subsystems described herein may be implemented differently to have fewer or more components than shown. Particular components common across different tiles of DP array 202 and having same reference numbers such as streaming interconnects 306, CDIs 314, DMA circuits 312, and the like have substantially the same functionality from one tile to another. It should be appreciated, however, that the particular implementation of such circuit blocks may differ from one type of tile to another. As an illustrative and non-limiting example, the number of ports of the streaming interconnect 306 may be different for a compute tile 216 compared to a memory tile 218 and/or an interface tile 222. Similarly, the number of channels of a DMA circuit 312 may be different in a compute tile 216 compared to a memory tile 218 and/or an interface tile 222. Appreciably, in other examples, the circuit blocks may be implemented the same across different tiles.

Figure 4A:
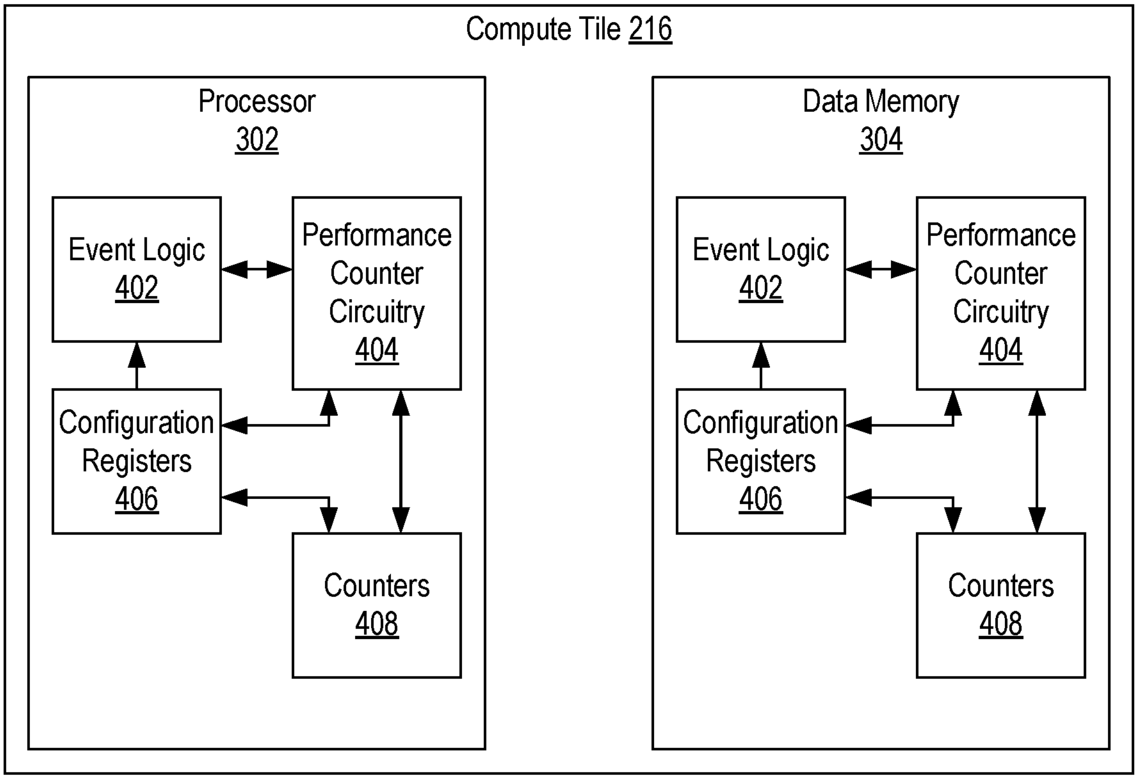
FIGS. 4A and 4B, taken collectively, illustrate various aspects of debug circuitry included in tiles of the data processing array.
Figure 4B:
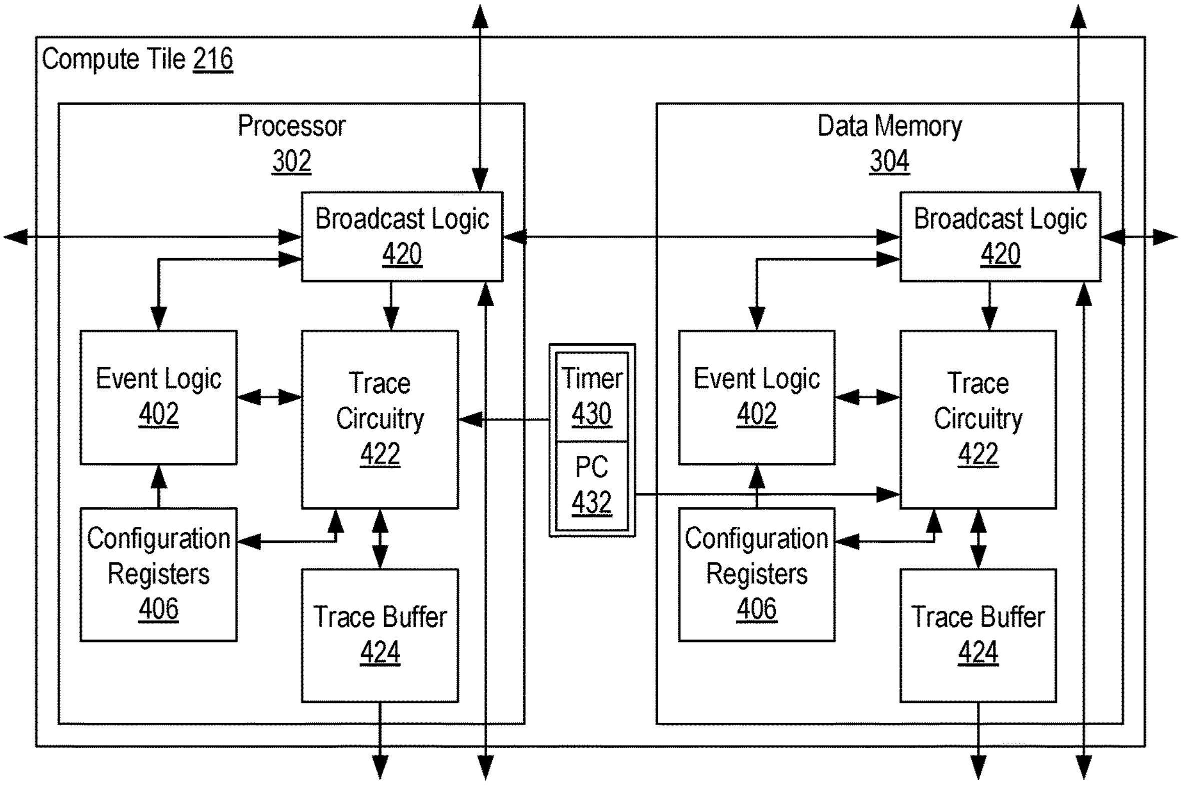

FIGS. 4A and 4B, taken collectively, illustrate various aspects of debug circuitry 308 included in the various tiles of DP array 202. Referring to FIG. 4A, the debug circuitry 308 of compute tile 216 may include a set of circuit blocks that are configurable to implement trace functionality. The circuit blocks include event logic 402, performance counter circuitry 404, configuration registers 406, and counters 408. As illustrated, the circuit blocks are implemented in both processor 302 and in data memory 304.

Event logic 402 is capable of detecting a plurality of different types of hardware events (e.g., trace data) within processor 302. Examples of hardware events that may be detected by event logic 402 may include, but are not limited to, function calls, function returns, stalls, data transfers, etc. The particular types of hardware events that are to be detected may be specified by configuration registers 406. For example, configuration registers 406 may have space for specifying up to 8 different types of hardware events to be detected out of a possible 128 different hardware events. Within this disclosure, hardware events also may be referred to as "trace events." The occurrence of particular trace events during the time in which trace is conducted may be counted by respective ones of counters 408, which may be controlled and/or managed by performance counter circuitry 404 based on other settings stored in configuration registers 406.

Debug circuitry 308 may be started and/or stopped in response to the occurrence of particular events as defined by data stored in configuration registers 406. For example, the monitoring and detection of trace events may be initiated in response to the detection of a particular event considered a trace start condition and stopped in response to the detection of a particular event considered a trace stop condition.

Configuration registers 406 may be programmed with user-specified runtime settings that define the trace start condition and the trace stop condition as well as the particular hardware events that event logic 402 is to monitor for and/or detect. In one or more examples, configuration registers 406 may be programmed after a design is loaded into DP array 202 for execution (e.g., at runtime). In one or more other examples, configuration registers 406 may be programmed, at least initially, with configuration data included in the particular design that is compiled and loaded into the DP array 202 for execution.

Referring to FIG. 4B, the debug circuitry 308 of compute tile 216 may include a set of circuit blocks that are configurable to implement further trace functionality. The circuit blocks include event logic 402, broadcast logic 420, trace circuitry 422, configuration registers 406, and trace buffer 424. As illustrated, the circuit blocks are implemented in processor 302 and in data memory 304. Further, the trace circuitry 422 in processor 302 and data memory 304 is coupled to a timer 430 and a program counter 432 so that each hardware event may be associated or stored with a timer value and/or a program counter value.

In the example, hardware events generated by event logic 402 may be provided to broadcast logic 420 and conveyed to one or more different broadcast logic 420 circuits in the same tile and/or in different tiles of DP array 202. This allows trace events to be conveyed to the broadcast logic 420 in data memory 304 in the same tile or to broadcast logic 420 of a different tile and/or different type of tile where the hardware events may be stored in a different trace buffer 424 and/or used to start trace in the destination tile or portion of the tile. Trace events may be conveyed from broadcast logic 420 to trace circuitry 422, where the trace events may be associated with the timer value and/or program counter and then stored in trace buffer 424. A stream of trace data may be output from trace buffer 424 for output from DP array 202. Broadcast functionality, e.g., which events are broadcast from each respective broadcast logic 420 and the destination broadcast logic 420 that receives such events, is configurable at runtime of DP array 202 and the user design.

While the examples of FIGS. 4A and 4B focus on compute tiles 216, it should be appreciated that the circuitry illustrated in FIGS. 4A and/or 4B also may be implemented in memory tiles 218 and/or interface tiles 222 as debug circuitry 308. In the case of memory tiles 218 and interface tiles 222, the circuitry may or may not be replicated as illustrated in the examples of FIG. 4.

Within this disclosure, hardware events are tracked and/or collected as trace data during execution of the user design. In some examples, the hardware events may be used as the trace start condition and/or the trace stop condition. In other examples, the hardware events are distinct from the trace start condition and/or the trace stop condition.

Figure 5:
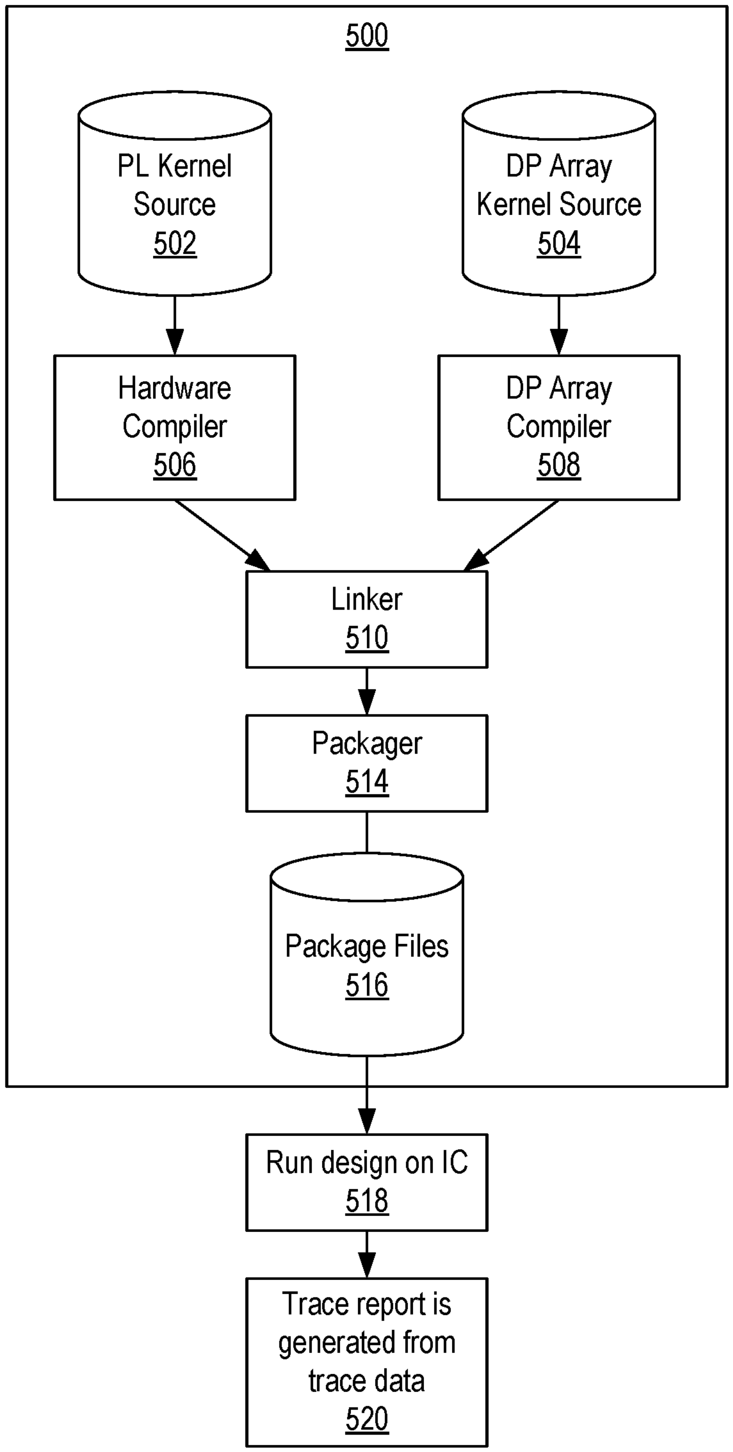
FIG. 5 illustrates an example method of performing hardware trace and analysis.

FIG. 5 illustrates an example method of performing hardware trace and analysis. The method of FIG. 5 includes a design flow 500 for implementing a user design in IC 150 having an architecture as described in connection with FIG. 2 or another architecture similar thereto. Design flow 500 may be performed by a computer such as data processing system 102.

As shown, source code of a user design specifying one or more programmable logic kernels (e.g., PL kernel source 502) is provided to a hardware compiler 506. Hardware compiler 506 may generate placed and routed versions of the user specified PL kernels of PL kernel source 502. Source code of the user design specifying one or more data processing array kernels (e.g., DP array kernel source 504) is provided to DP array compiler 508. DP array compiler 508 may generate executable and placed versions of DP array kernels of DP array kernel source 504. The compiled PL kernel source 502 and the compiled DP array kernel source 504 are provided to linker 510.

Linker 510 receives the compiled PL kernel source 502 and the compiled DP array kernel source 504 and operates on both based on user specified compilation options. The compilation options may be specified via any of a variety of user input mechanisms. In one aspect, the compilation options may be specified as command line options. The compilation options may specify a particular offload circuit architecture that is to be implemented in IC 150 to connect DP array 202 with one or more other circuits for offloading trace data.

Linker 510 is capable of including a particular offload circuit architecture specified by the user as a compilation option. Linker 510, for example, adds the specified offload circuit architecture and connects the specified offload circuit architecture to DP array 202 and to another circuit external to DP array 202 such as NoC 208. Trace data may be output from DP array 202 as one or more different streams of trace data. One type of offload circuit architecture that may be included by linker 510 implements one or more data paths in PL 204. In general, one or more data paths may be implemented to convey the streams of trace data. In some examples, one data path may be created in PL 204 for each different stream of trace data that is output from DP array 202. Other implementation options, however, are available. Each data path may have a data mover (circuit) to be described herein in greater detail. Another type of offload circuit architecture that may be included by linker 510 is implemented using the DMA circuit 312 of one or more interface tiles 222. As noted, a DMA circuit 312 is a type of data mover circuit.

An example of a user provided command that may be entered into a command line to specify compilation options is illustrated in Listing 1.

Listing 1

```
aiecompiler <options> --event-trace=runtime --num-trace-streams=16
-trace-plio- width=64 --event-trace-port=plio
```

In the example of Listing 1, the compilation parameters include the number of streams of trace data to be output from DP array 202 to be 16. Further, compilation parameters specify the PLIO (Programmable Logic I/O) trace data offload option indicating that the offload circuit architecture is to be implemented in PL 204. Given the configurability of PL 204, the width of each stream of trace data and the corresponding data path through PL 204 also may be specified. The example of Listing 1 illustrates that the user may specify the number of streams of trace data that will be output from DP array 202. In a DMA-based implementation of the offload circuit architecture (e.g., specified using a Global Memory I/O or "GMIO" compilation option), the width of the streams is fixed. As part of placing and routing the DP array kernels of DP array kernel source 504, DP array compiler 508 further generates a routing for the trace data based on the number of streams specified by the user.

From the linked components generated by linker 510, packager 514 is capable of generating one or more output files as package files 516. Package files 516 may include binary files/images that may be loaded into IC 150 to implement the user design (e.g., PL kernel source 502 and DP array kernel source 504) within IC 150 along with the selected offload circuit architecture. Packager 514, for example, is capable of generating the files required for IC 150 to boot and run the user design for performing trace.

In one or more example implementations, linker 510 is capable of generating a metadata section that may be included in package files 516. The metadata section may specify information such as DP array kernel to tile mapping, instance names for functions of kernels, addresses, versions, and/or other properties of DP array kernels as compiled and mapped to tiles of DP array 202. As kernels are included in graphs, the metadata further specifies graph to tile mapping. While configuration data for loading into configuration registers 406 may be included in package files 516, in other cases, such data may be written to the configuration registers 406 at runtime of a user design responsive to user-provided commands.

For example, data processing system 102 may receive user commands (e.g., in real-time), parse the commands using the metadata and/or other user-specified runtime settings, generate configuration data for configuration registers 406 of selected tiles of DP array 202 used by the design for performing trace (e.g., active tiles), and provide such data to IC 150 to be written to configuration registers 406 of selected ones of the active tiles of DP array 202.

In another example, user commands may be provided to runtime program code executing on PS 206. The runtime program code may parse the commands using the metadata and/or other user specified runtime settings, generate configuration data for configuration registers 406 of selected tiles of DP array 202 used by the design for performing trace (e.g., active tiles), and write such data to configuration registers 406 of selected ones of the active tiles of DP array 202.

In block 518, the user design as compiled is run on IC 150. More particularly, the user design is loaded into IC 150 and is executed (or started). The user design is configured to perform trace functions. During operation, one or more selected tiles of the active tiles of DP array 202 generate and output trace data that may be stored in a memory. In block 520, data processing system 102 is capable of generating a trace report from the trace data. The trace data may be provided to, or obtained by, data processing system 102, which executes one or more analysis tools. The analysis tools are capable of processing the trace data to generate the trace report.

Within this disclosure, particular operations described herein may be performed by the runtime program code that executes in cooperation with the user's design as implemented in DP array 202. The runtime program code may be executed by a processing unit of the PS 206 within IC 150 (e.g., as opposed to in data processing system 102). In the alternative or in addition, data processing system 102 may be coupled to IC 150 by way of a different physical connection such as a Joint Test Action Group (JTAG) connection, a serial connection, or an Ethernet connection. In that case, data processing system 102 may communicate with IC 150 via the physical connection and a hardware server executing in the data processing system 102 that is capable of communicating with IC 150 and loading configuration data into configuration registers 406.

The runtime program code, in executing on PS 206 along with an operating system (e.g., Linux), has access to drivers that are executed locally in PS 206 in IC 150. PS 206 is directly coupled to the various subsystems of IC 150 so as to directly access (e.g., read and/or write) configuration registers 406 of DP array 202. The PS 206 is capable of directly accessing configuration registers 406 of DP array 202. This provides increased security in that data processing system 102 is unable to access such configuration registers directly. The runtime program code, as executed by PS 206, is capable of accessing a driver to communicate directly with DP array 202. For this reason, data processing system 102 may not perform the operations described herein as attributable to the runtime executing in PS 206.

In the case where data processing system 102 accesses IC 150 via an alternative connection such as JTAG, data processing system 102 executes the hardware server implemented in IC 150. The hardware server may have access to configuration registers 406 by way of the physical connection (e.g., JTAG) albeit in a manner that may bypass the operating system and/or runtime program code executed by PS 206.

Within this disclosure, a particular user design for DP array 202 may include one or more graphs. Each graph may be considered a different application that executes in DP array 202, e.g., in different compute tiles 216 of DP array 202. The graphs (e.g., applications) may execute concurrently in the different tiles and also may execute independently of one another. For example, a first graph of the user design may execute to process data in one or more compute tiles of DP array 202 and output data to other subsystem(s) of IC 150. A second graph of the user design may execute in one or more other or different compute tiles of DP array 202 and output data to other subsystems of IC 150. The first and second graphs are implemented concurrently in DP array 202 and execute concurrently. The second graph may receive data from sources that are the same and/or different than the sources of data for the first graph. In some cases, data from the first graph may be processed through one or more other subsystems of IC 150 and provided to the second graph for additional processing.

Figure 6:
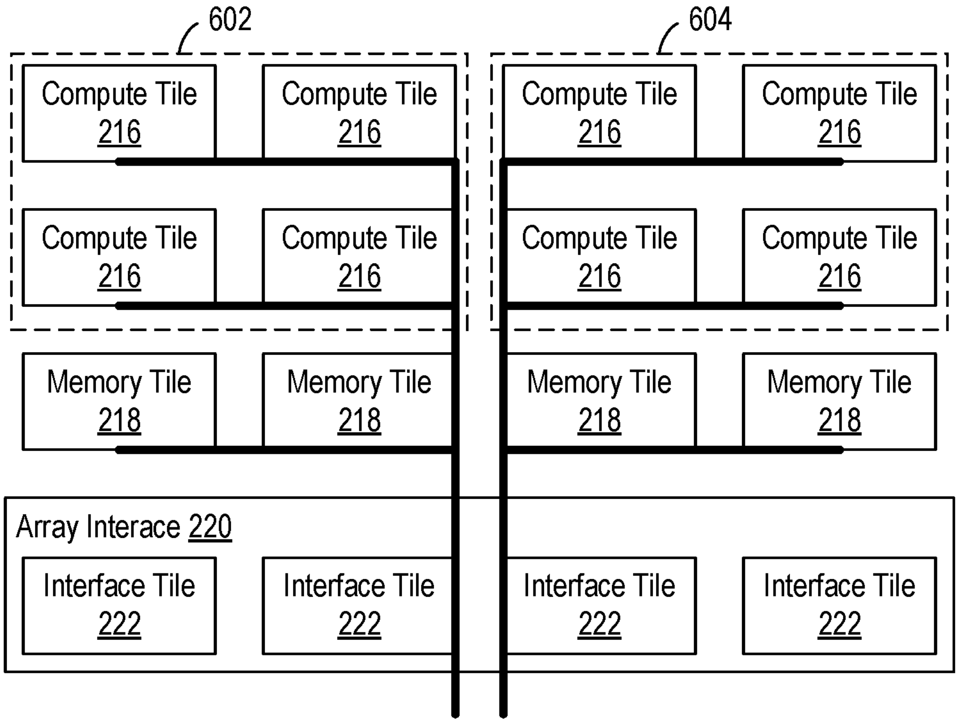
FIG. 6 illustrates an example implementation of a user design for a data processing array.

FIG. 6 illustrates an example implementation of a user design for DP array 202 where the user has specified 2 streams of trace data as a compilation option. For purposes of illustration, each of compute tiles 216 and each of memory tiles 218 is used by the user's design. Within this disclosure, each tile that is used by a user's design is referred to as an active tile. In other cases, not all tiles may be used to implement/execute a user's design. Thus, not all tiles of DP array 202 may be active tiles.

In the example, DP array compiler 508 has connected each active tile for purposes of routing trace data to a stream. Each tile that is configured to perform trace contributes trace data to a particular stream as routed in DP array 202. Thus, the particular streams for conveying trace data as implemented in DP array 202 may be shared among multiple tiles. For example, the user specifies the number of streams desired as a compilation option. A "stream" within the DP array 202 refers to a data path or route through one or more stream switches of tiles of the DP array 202 through which data (e.g., trace data) is conveyed. DP array compiler 508 creates connections for each tile used in the user's design to a stream of trace data. If the user specifies 16 streams of trace data and there are 64 active tiles in the DP array 202, DP array compiler 508 will create the 16 streams. As an example, each stream may have 4 different tiles connected thereto that contribute trace data to the stream. Thus, streams may include trace data generated by more than one tile. Appreciably, however, the particular number of tiles on a given stream may depend on other factors such as the placement of the kernels to tiles. Thus, there is no requirement to have an even distribution of active tiles to streams.

The trace data is conveyed over ports that are available on streaming interconnects 306 (also referred to as "stream-switches"). In some tiles, trace data may be provided to streaming interconnects 306 by way of dedicated ports thereon. Once provided to a streaming interconnect 306, the trace data may be routed through any of the available ports of the stream interconnect 306. The routing is determined at compile time. In one or more other examples, tiles may include a dedicated trace data network that may operate independently of the streaming interconnects.

For purposes of illustration, the user design of FIG. 6 may include two different graphs shown as graph 602 and graph 604. In this example, graph 602 is implemented using 4 compute tiles. Graph 604 is implemented using 4 different compute tiles. A user design may include a single graph or two or more graphs as described herein.

Figure 7A:
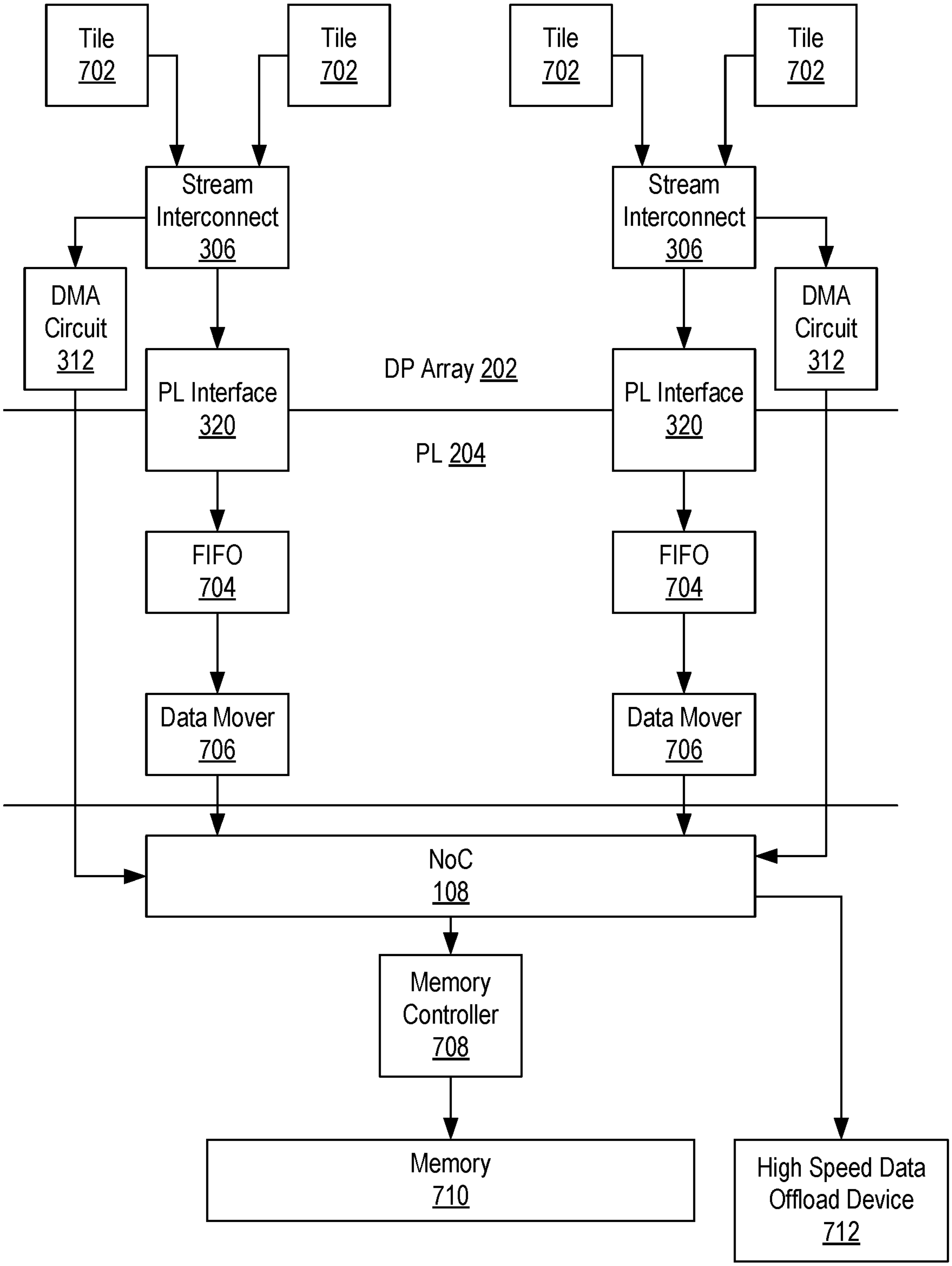
FIGS. 7A, 7B, and 7C illustrate examples of offload circuit architectures that may be implemented to convey trace data from a data processing array.
Figure 7B:
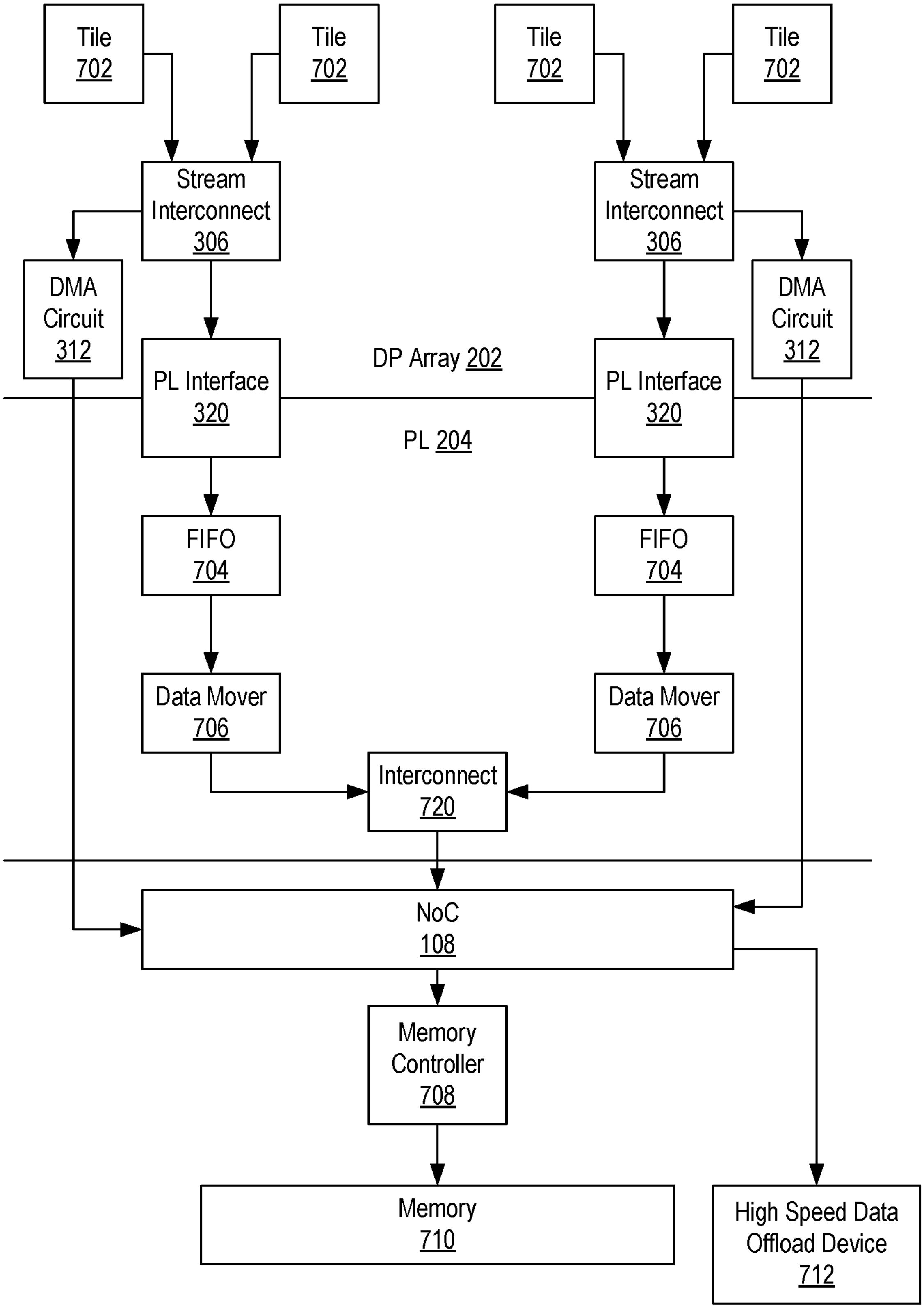
Figure 7C:
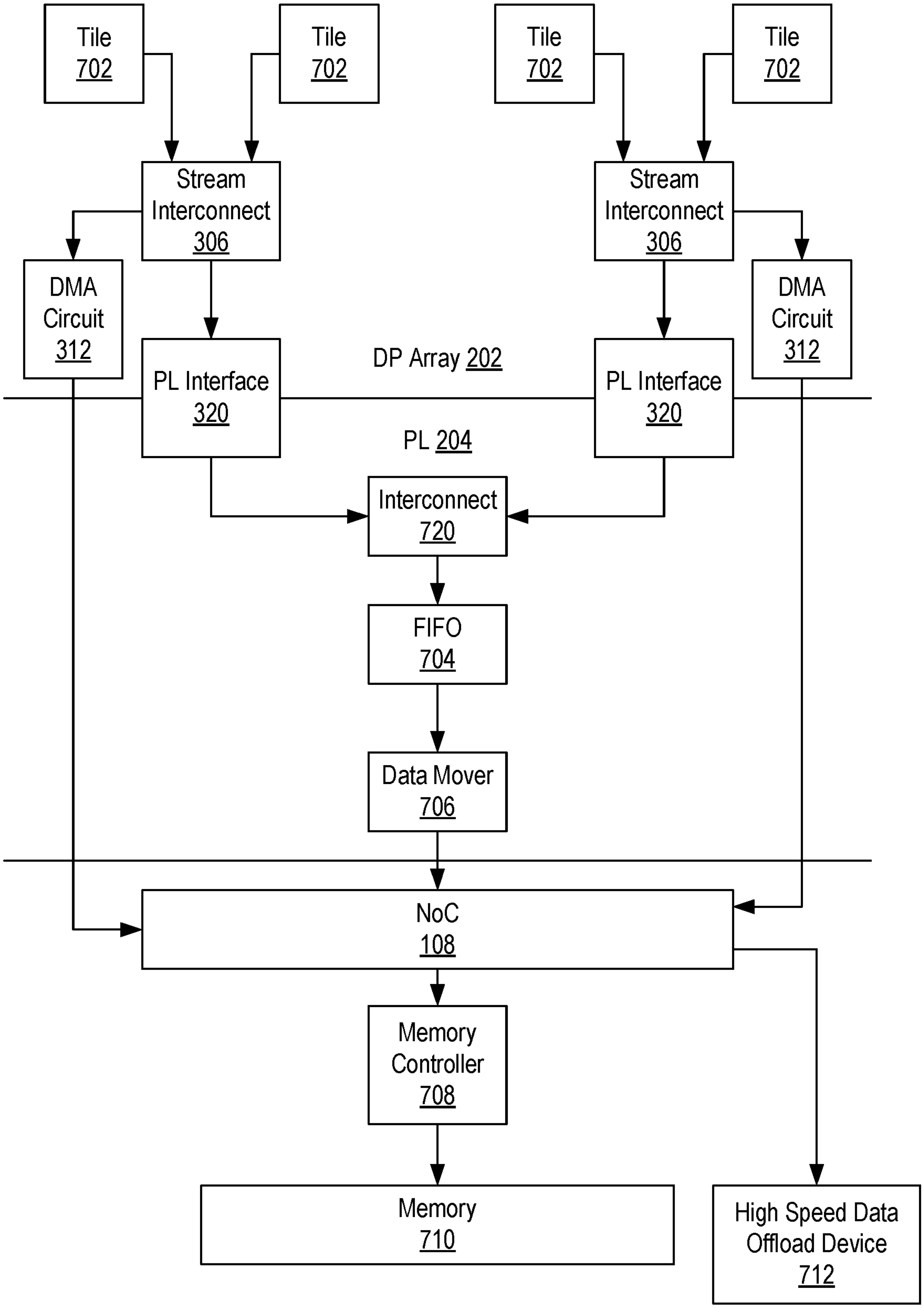

FIGS. 7A, 7B, and 7C illustrate examples of the offload circuit architectures that may be implemented to convey trace data from DP array 202. In the example of FIG. 7A, tiles 702 may represent any combination of compute tiles 216, memory tiles 218, and/or interface tiles 222. Stream interconnects 306, DMA circuits 312, and PL interfaces 320 may be disposed in interface tiles 222. For purposes of illustration, the user has selected, by way of compilation options, to implement two streams of trace data. In the example, each tile 702 outputs a single stream of trace data. In other examples, tiles 702 may be implemented to output two or more streams of trace data. The data output from tiles 702 is not considered equivalent to the streams (e.g., number of streams) specified by the user. Streaming interconnects 306, for example, are capable of combining streams received from different ones of tiles 702 based on the routing to form the particular number of user-specified streams that are output from DP array 202, which is 2 in this case.

The examples of FIGS. 7A, 7B, and 7C illustrate the two different types of offload circuit architectures being implemented. For purposes of illustration, both are illustrated as being implemented concurrently. It should be appreciated, however, that only one of the two types illustrated would be implemented for a given user design.

Referring to FIG. 7A, as illustrated, trace data from active tiles 702 of DP array 202 are routed to provide trace data to respective streaming interconnects 306 disposed in one or more of the tiles of DP array 202. In the case where the user has selected the DMA-based option (e.g., GMIO), the trace data is routed to DMA circuits 312. DMA circuits 312 may be directly coupled to NoC 208 to provide trace data thereto. In the example, each DMA circuit 312 provides one stream of trace data. In other examples, each DMA circuit 312 may be capable of conveying two or more streams of trace data. Though the connections from DMA circuits 312 to NoC 208 are shown as traversing through PL 204, it should be appreciated that DMA circuits 312 may be directly coupled to NoC 208 so as not to utilize or require any circuit resources of PL 204 to establish the connections illustrated.

In the case where the user has selected the PL-based option, the trace data is routed to and through PL 204. In the example, each data path includes a first-in-first out memory (FIFO) 704 coupled to a data mover 706. Each data mover 706 couples to NoC 208. Each FIFO 704 couples to a PL interface 320 of an interface tile 222. The FIFOs 704 and the data movers 706 are inserted into the design as discussed during the linking phase. In one aspect, the depth of each FIFO 704 may be specified by the user as compilation parameters.

In the example of FIG. 7, both the PL-based option and the DMA-based option utilize data movers. Data movers refer to circuits that are configured to convert streaming data to memory-mapped data. The data movers (e.g., 706 and 312) connect to each stream of trace data (e.g., an Advanced Microcontroller Bus Architecture (AMBA) extensible Interface (AXI) stream), convert the stream to memory-mapped data, and may function as master circuits that write the trace data to a memory 710 via NoC 208. The data movers may write the data at high data rates. As part of the linking process of design flow 500, linker 510 defines the Quality-of-Service (QOS) values for routing the trace data through pathways of NoC 208 based on bandwidth estimates for the trace data that is expected to be generated. The estimates may be initially performed by DP array compiler 508 compiler and delivered to linker 510. The QoS values may be refined by linker 510 to ensure that system-level limits and specifications for the user's design also are met.

Trace data may be offloaded from NoC 208 to a high-speed data offload device 712 that is external to the target IC and includes circuitry capable of providing the bandwidth necessary to store the trace data. Trace data also may be offloaded to memory 710 from NoC 208 by way of memory controller 708. Memory controller 708 is an example of an HCB 212. Memory 710 may be a DDR memory. In one aspect, memory 710 is implemented as volatile memory 160 of FIG. 1 (e.g., an external memory). In one or more other examples, memory 710 may be implemented as an internal memory (e.g., an HCB 212).

In one aspect, as part of the design flow, trace buffers within memory 710 may be allocated to each data mover. Whether trace data is written to memory 710 or to high-speed data offload device 712, the trace data may be obtained by data processing system 102 and analyzed to generate a trace report.

In the example of FIG. 7A, memory controller 708 is illustrated as the merge point where the various streams of trace data are merged together as data traffic written to memory 710. In the example of FIG. 7A, each stream of trace data requires its own entry point to NoC 208, e.g., its own NoC master circuit to place the data onto NoC 208.

In another example implementation, the merge point and/or points may be adjusted by including further interconnect circuitry. FIGS. 7B and 7C illustrate alternative implementations for the PLIO implementation option. The example of FIG. 7B incorporates an interconnect 720 as a merge point after data movers 706. As shown, each data mover 706 outputs data to interconnect 720. Interconnect 720 is connected to NoC 208. In this example, only one entry point to NoC 208 is needed as the two traces are merged prior to entry into NoC 208.

In the example of FIG. 7C, the merge point implemented by interconnect 720 is moved prior to FIFOs 704. As shown, each PL interface 320 connects to interconnect 720. From interconnect 720, a single FIFO 704 is used along with a single data mover 706 that connects to NoC 208 through a single entry point. In each of FIGS. 7B and 7C, the number of entry points into NoC 208 is reduced for a given number of streams of trace data. The NoC master circuits are hardened circuit blocks available in limited numbers. In the case where streams are merged, the number of buffers needed may not coincide with the number of data movers used.

Figure 8:
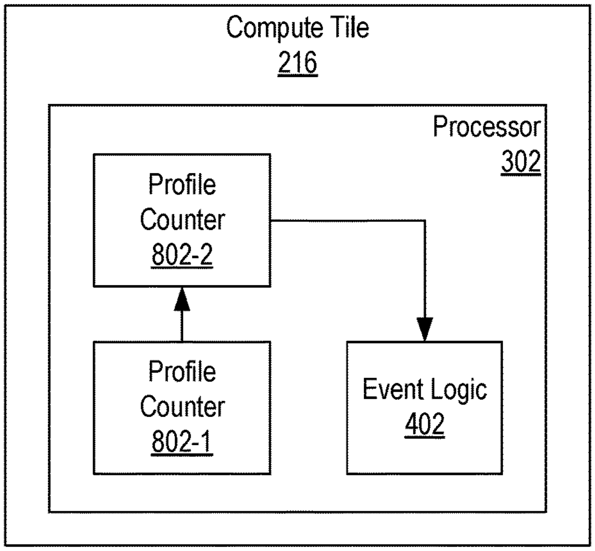
FIG. 8 illustrates an example configuration of debug circuitry that supports time-based control of trace functionality in tiles of a data processing array.

FIG. 8 illustrates an example configuration of debug circuitry 308 that supports time-based control of trace functionality in tiles of DP array 202. In the example of FIG. 8, a user may specify the trace start condition and the trace stop condition in terms of time. In one aspect, the trace start condition and trace stop condition may be user-specified runtime settings that define a particular number of clock cycles (e.g., after the start of execution of the user design) where trace is to start and a particular number of clock cycles (e.g., after the start of trace) where trace is to end.

In the example, trace functionality may be started and stopped using profile counters 802. Profile counters 802 may be used to track the trace start condition and trace stop condition and, in response to detecting such conditions, instruct event logic 402 to start trace and stop trace. In one aspect, profile counters 802 are arranged in a daisy chained configuration where a first profile counter 802-1 is coupled to a second profile counter 802-2. Profile counter 802-1 may be used to trigger operation of profile counter 802-2.

In one or more example implementations, the user may specify the trace start condition and the trace stop condition in terms of clock cycles. In one or more other example implementations, the user may specify the trace start condition and the trace stop condition in terms of regular time that may be translated into an equivalent, or substantially equivalent, number of clock cycles. Regular time refers to an amount of time specified in terms of seconds or sub-second increments (e.g., milliseconds) as opposed to clock cycles of DP array 202. The user may provide the trace start condition and the trace stop condition to appropriate program code, whether scripts executing in data processing system 102 and/or the runtime program code executing in PS 206. The program code may perform the translation of seconds to clock cycles if required.

In one aspect, profile counters 802 may be implemented as additional counters that are distinct from counters 408 and that are reserved for defining trace start conditions and/or trace stop conditions in tiles of DP array 202. In another example implementation, profile counters 802 may be a subset of counters 408 that may be used for defining trace start conditions and/or trace stop conditions. In any case, counters 802 may be configured to generate events at designated times to start trace and to stop trace.

In one or more example implementations, each profile counter 802 may be implemented as a 32-bit counter that is capable of counting up to 2ˆ32 clock cycles. In cases where both the trace start condition and the trace stop condition specify a number of clock cycles within the range of one counter, a single profile counter 802 may be used to generate events that are provided to event logic 402 to start and stop trace. For example, in response to the user design beginning execution in DP array 202, where the illustrated compute tile 216 is an active tile, profile counter 802-2 may begin operation counting clock cycles. In response to profile counter 802-2 reaching a first predetermined counter value as defined by the trace start condition, profile counter 802-2 may instruct event logic 402 to begin trace. In response to counter 802-2 reaching a second predetermined counter value as defined by the trace stop condition, profile counter 802-2 may instruct event logic 402 to stop trace. With a 32-bit counter implementation and clock(s) of DP array 202 operating at 1 GHZ, a single profile counter 802 is capable of providing approximately 4 seconds of delay after the start of execution of the user design in terms of the start time for trace. Similar operation may be implemented to stop trace.

In cases where one or both of the trace start condition and the trace stop condition specify a number of clock cycles that fall outside of the range of one profile counter 802, two or more such counters may be used. For example, in response to the user design beginning execution in DP array 202, where the illustrated compute tile 216 is an active tile, profile counter 802-1 and profile counter 802-2 may begin operation. Profile counter 802-1 increments responsive to each clock cycle. In response to profile counter 802-1 reaching a first predetermined counter value or rolling over, profile counter 802-2 may cause profile counter 802-2 to increment. In response to profile counter 802-2 reaching a first predetermined counter value as defined by the trace start condition, profile counter 802-2 instructs event logic 402 to begin trace. In response to counter 802-2 later reaching a second predetermined counter value as defined by the trace stop condition, profile counter 802-2 may instruct event logic 402 to stop trace.

Referring to the prior example, consider the case where the clock of DP array 202 is a 1 GHz clock and the user desires trace to start approximately 10 seconds after the start of execution of the user design. In that case, profile counter 802-1 may be configured to signal profile counter 802-2 to increment after approximately 3.3 seconds. In that case, profile counter 802-1 is configured to signal profile counter 802-2 in response to counting a number of clock cycles equivalent or that approximate 3.3 seconds. Profile counter 802-1 may reset and start counting anew once the specified number of clock cycles corresponding to 3.3 seconds is reached. In response to profile counter 802-2 reaching a count of 3 corresponding to approximately 10 seconds, profile counter 802-2 may instruct event logic 402 to begin trace. Similar operations may be implemented to stop trace.

In the example of FIG. 8, a user need not re-compile the user design to start and/or stop trace at different times. Trace may be controlled by the user at runtime of the user design. That is, profile counters 802 may be configured and reconfigured with different thresholds and/or values at runtime of the user design.

Figure 9:
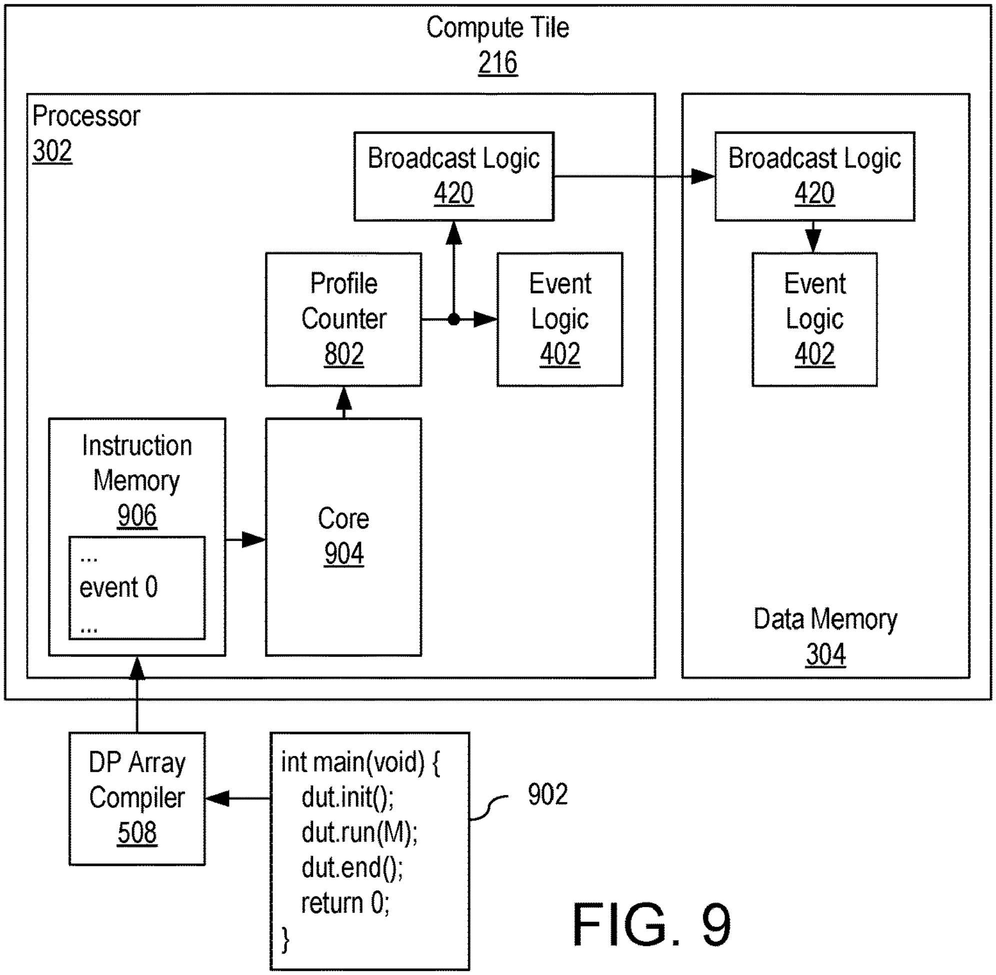
FIG. 9 illustrates an example configuration of debug circuitry that supports iteration-based control of trace functionality of tiles of a data processing array.

FIG. 9 illustrates an example configuration of debug circuitry 308 that supports iteration-based control of trace functionality of tiles of DP array 202. In the example of FIG. 9, compilation or recompilation of the user design is required to enable trace. As illustrated, host program code 902 (e.g., executable by PS 206), controls execution of the user design as implemented in DP array 202. In the example, "dut.run(M);" specifies that the user design is to iterate "M" times. Each iteration is one complete execution of the user kernel (not shown in FIG. 9). Listing 2 illustrates an example of the user kernel that is executed in DP array 202 by the host program code 902. As illustrated, "event 0," which is a user event, is inserted into the user program code and called before each execution of the kernel. That is, the "event 0" is inserted for each kernel of the user design and, as such, may be referred to as a "graph iterator."

Listing 2

```
// User kernel
void mykernel ( )
{
  ... // Event 0 is called before/after execution for this case
  ...
  return..
```

-continued

Listing 2

```
}
// How the above is called within DP array based on host program code
902: main ( )
{
  ...
  // Run the below M times:
  event0;
  mykernel( );
  ...
}
```

The user design is compiled by DP array compiler 508 resulting in executable program code that is loaded into compute tiles 216 of DP array 202. As shown, processor 302 of compute tile 216 includes a core 904 that is capable of executing program code stored in an instruction memory 906. The compiled graph 902, as stored in instruction memory 906, generates an "event 0" corresponding to the compiled "event0" instruction. In the example, DP array compiler 508 inserts "event0" in Listing 2 so that every time an iteration of the kernel occurs, event 0 is generated. In this example, "event 0" is considered a graph iteration event. The graph iteration event is a type of user-specified event (e.g., a user event).

Upon core 904 encountering "event0", core 904 outputs event 0 to profile counter 802. In the example, event 0 is a graph iteration event having a particular or enumerated identifier. Profile counter 802 is configured to count graph iteration events with the enumerated identifier. User-specified runtime settings may set a trace start condition and a trace stop condition as a number of occurrences of a graph iteration event with the enumerated identifier. Based on the user-specified runtime settings, profile counter 802, in response to counting a first specified number of the graph iteration events with the enumerated identifier from core 904, instructs event logic 402 to begin trace. Based on the user-specified runtime settings, profile counter 802, in response to counting a second specified number of the graph iteration events with the enumerated identifier from core 904 instructs event logic 402 to stop trace.

In this regard, trace functionality may be controlled based on the number of iterations of a particular graph of the user's design. As each graph executes on one or more particular tiles, the trace functionality for the particular set of active tiles executing the graph (e.g., a portion of the larger user design) may be controlled independently of active tiles executing other graphs of the user design. In any case, the start and stop of trace for such active tiles executing a graph may be predicated on the number of iterations of the graph during execution of the user design.

In the example of FIG. 9, broadcast logic 420 is also used. Broadcast logic 420 in processor 302 also may receive the instructions to start and/or stop trace from profile counter 802. Broadcast logic 420 allows the trace start condition and/or trace stop condition detected in one tile and/or in one portion of a tile, to be broadcast to a different tile and/or to a different portion of the same tile. In the example, broadcast logic 420 in processor 302 conveys the trace start condition and trace stop condition as detected in processor 302 of compute tile 216 to broadcast logic 420 of data memory 304 in the same compute tile 216. The trace start condition (e.g., instruction to start trace), as broadcast from broadcast logic 420 in processor 302, is received by broadcast logic 420 in data memory 304. In response to receiving the broadcasted trace start condition, broadcast logic 420 in data memory 304 instructs event logic 402 in data memory 304 to start trace. The trace stop condition (e.g., instruction to stop trace), as broadcast from broadcast logic 420 in processor 302, is received by broadcast logic 420 in data memory 304. In response to receiving the broadcasted trace stop condition, broadcast logic 420 in data memory 304 instructs event logic 402 in data memory 304 to stop trace.

As discussed, broadcast functionality may be controlled at runtime. By controlling broadcast functionality at runtime (e.g., which broadcast logic 420 is broadcasting which events and to which other broadcast logic(s) 420), the particular tiles or portions of tiles that perform trace may be controlled by providing selected trace start conditions and/or trace stop conditions to particular broadcast logic 420 destinations. Once trace is started, regardless of the manner in which the trace is started, event logic 420 may detect particular hardware events as configured by the user-specified runtime settings.

In one or more other examples, the trace start condition and trace stop condition may be broadcast to one or more other tiles. The other tiles to which the trace start and/or stop conditions are broadcast may be different types of tiles. This allows trace to be started and/or stopped in selected memory tiles 218, in selected interface tiles 222, and/or in other selected compute tiles 216 based on trace start and/or stop conditions that are detected in a particular compute tile 216. Another example implementation of this functionality would be to broadcast a trace start condition to a DMA-only tile. A DMA-only tile refers to a compute tile 216 of DP array 202 that only uses data memory 304 and not processor 302 as part of the user design. Regardless of the particular configuration, in general terms, the particular trace start condition and/or trace stop condition may be detected in, and received from, a different tile. The source of the trace start condition and/or trace stop condition also may be a tile other than the particular tile performing trace (e.g., the tile receiving the condition(s)).

In the example of FIG. 9, the particular events illustrated only occur in compute tiles 216, but may be used to start and/or stop trace as performed in other types of tiles. That is, trace may be started and/or stopped in memory tiles and/or interface tiles based on the user events that occur through execution of program code by core 904 in a compute tile 216. Appreciably, as memory tiles 218 and interface tiles 222 lack processors 302, generation of such event is not feasible in such tiles.

In the example of FIG. 9, the threshold values for profile counter 802 to start trace and to stop trace may be configurable at runtime. That is, the trace start condition and the trace stop condition, specified as thresholds for profile counter 802, may be changed at runtime without recompiling the user design. If only the number of iterations of the graph used to initiate trace and/or to stop trace are changed, such changes may be made at runtime without recompiling the user design.

Figure 10:
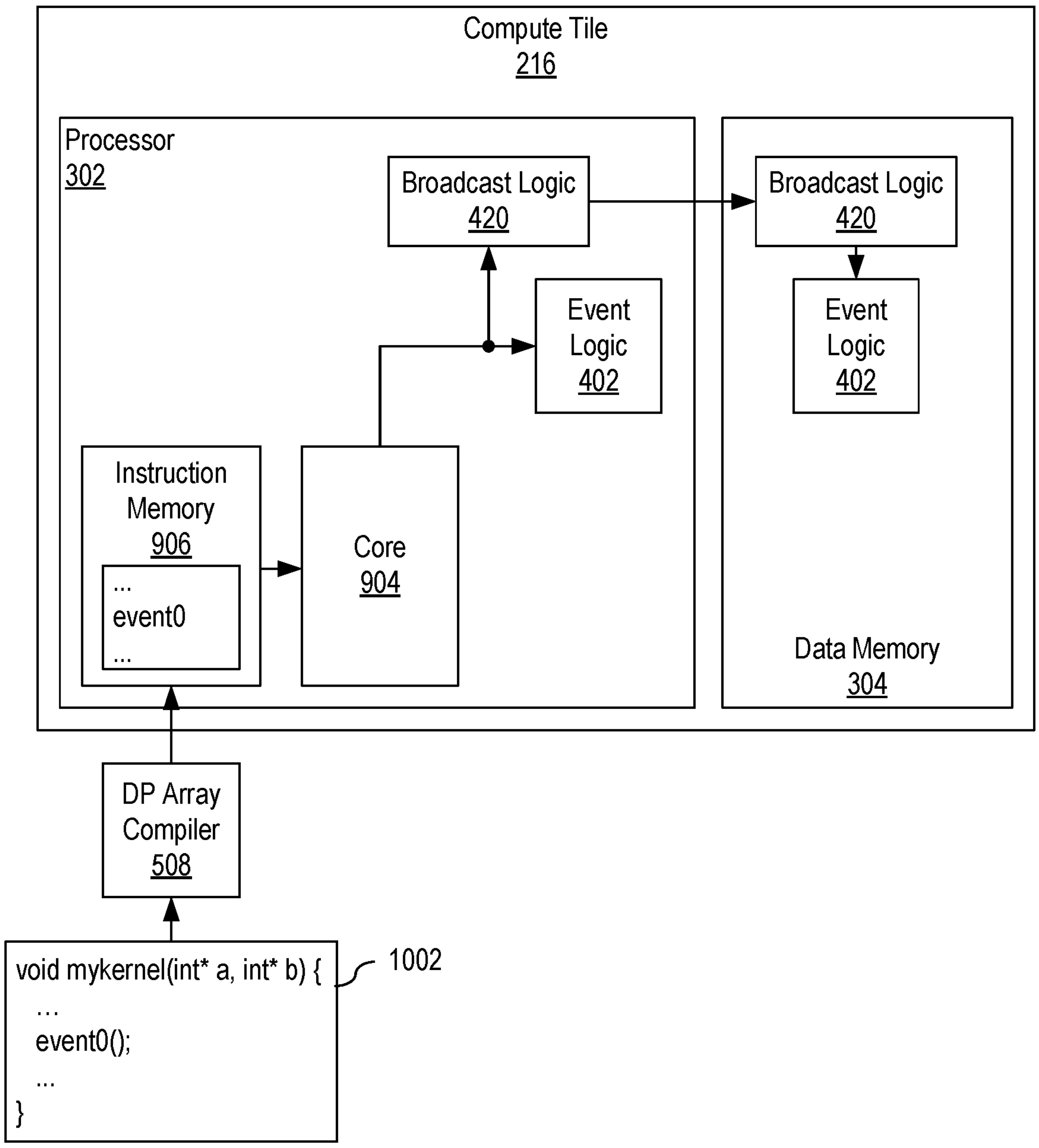
FIG. 10 illustrates an example configuration of debug circuitry that supports starting trace from any point or location within a user design.

FIG. 10 illustrates an example configuration of debug circuitry 308 that supports the start of trace from any point or location within the user design. In the example of FIG. 10, the user inserts a particular user event shown as "event0 ( )" at a desired location in a kernel 1002 of a user design. In the example, the event is inserted at a particular location within kernel 1002, which is a user-specified or selected kernel. Inserting an event in kernel code means the trace trigger can be data driven or based on more complex happenings than is the case with the other examples described herein. For example, trace may be triggered by events, triggered by certain operations, triggered by certain calculations and/or data values (e.g., as calculated by processor 302) individually and/or in any combination.

Event generation may work similar to the example of FIG. 9. In the example of FIG. 10, however, profile counter 802 is not required to count occurrences of the event. In response to the event being executed in kernel 1002 by core 904, core 904 instructs event logic 402 to begin trace. In this example, the event generated is considered a kernel event and is also considered a user-specified event. A similar mechanism may be used to control the stopping of trace. That is, another different kernel event may be included in kernel 1002 or another location in the user design that, when executed by core 904, causes core 904 to instruct event logic 402 to stop trace. For example, an event0 kernel event may start trace while an event1 kernel event may stop trace.

The broadcast functionality where trace start conditions and/or trace stop conditions are broadcast to different parts of a same tile and/or to different tiles (and potentially different tile types) may be implemented substantially as described in connection with FIG. 9. In the example of FIG. 10, particular events that occur in only one type of tile (e.g., a compute tile) may be used to start and/or stop trace as performed in other types of tiles.

In the example of FIG. 10, to change the trace start condition and/or the trace stop condition, the user design must be recompiled. That is, to change the trace start condition and/or the trace stop condition, the inserted event instructions must be moved to different locations and the user design recompiled and reloaded into DP array 202 for execution.

Figure 11:
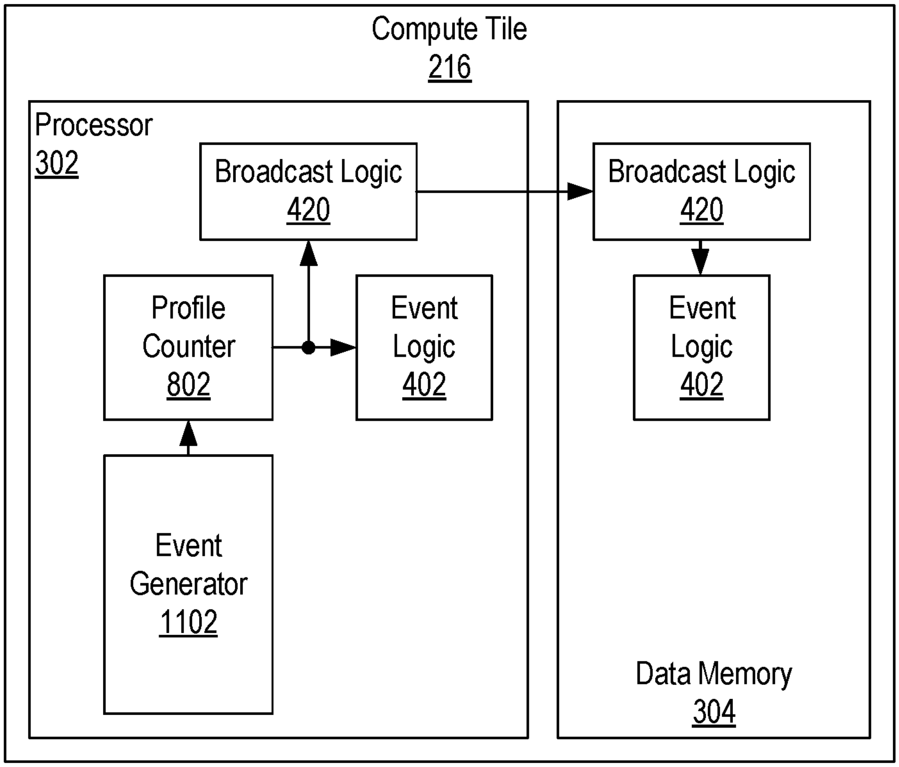
FIG. 11 illustrates an example configuration of debug circuitry that supports starting and/or stopping of trace based on the detection of particular hardware events generated within tiles of a data processing array.

FIG. 11 illustrates an example configuration of debug circuitry 308 that supports the start and/or stop of trace based on the detection of particular hardware events generated within tiles of DP array 202. As discussed, each tile includes a variety of different hardware components. These components may include interconnects, DMA circuits, and the like. An interconnect, in and of itself may include other components such as FIFOs. These different varieties of components included in a tile are capable of generating hardware events in response to particular conditions. For example, a buffer (e.g., a FIFO memory) of an interconnect may generate an event indicating that the buffer is full; a DMA circuit may generate an event in response to starting a particular data transfer and/or in response to completing the particular data transfer; hardware locks 310 may generate hardware events indicating that particular locks are put in place and/or released; and the like.

In the example of FIG. 11, the trace start condition may be specified as a particular type of hardware event, or particular number of such events, as generated by a particular component of a tile illustrated as event generator 1102. Similarly, a trace stop condition may be specified as a particular type of hardware event, or particular number of such events, as generated by a particular component of a tile. The component may be the same component (e.g., event generator 1102) that generated the trace start condition or a different component. In one or more other examples, a trace start condition and/or a trace stop condition may be specified by a user as a particular combination of hardware events. It should be appreciated that the particular types of hardware events used to start and/or stop trace may vary based on the type of tile in which trace is desired. As another example, an event that may be used as a trace start condition may be an error in a tile. Examples of errors include, but are not limited to, a memory out of range error and/or an AXI error. Using an error as a trace start condition ensures that the error initiates trace no matter when the error occurs.

In one or more example implementations, each event may be accompanied by a particular address for the component that generated the event. In one or more other examples, only particular events from particular addresses (e.g., components) may be used as a trace start condition and/or a trace stop condition.

In one or more of the examples described in connection with FIG. 11, profile counter 802 is optional. That is, trace start conditions and/or trace stop conditions that do not rely on counting a number of occurrences (e.g., are triggered in response to a first occurrence of a particular event) do not require profile counter 802. In one or more other examples, profile counter 802 may be configured to count only particular events and/or particular events from particular addresses (e.g., components) and/or to start and/or stop trace in response to reaching particular counter values.

The broadcast functionality where trace start conditions and/or trace stop conditions are broadcast to different parts of a same tile and/or to different tiles (and potentially different tile types) may be implemented substantially as described. In the example of FIG. 11, particular hardware events that occur in only one type of tile may be used to start and/or stop trace as performed in other types of tiles.

Figure 12:
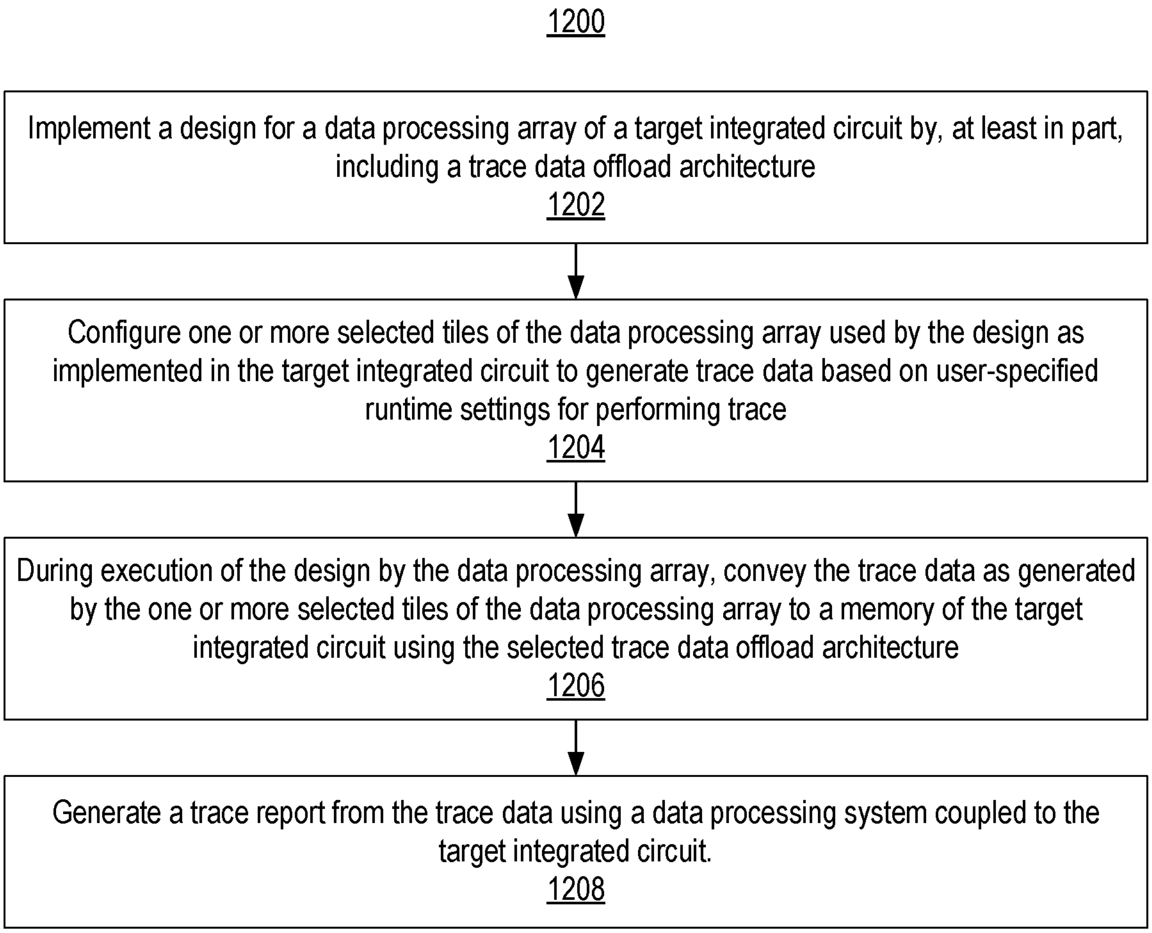
FIG. 12 illustrates an example method of implementing trace for a data processing array of an integrated circuit.

FIG. 12 illustrates an example method 1200 of implementing trace for a data processing array of an IC. In block 1202, a design for DP array 202 is implemented in IC 150. The design may be implemented, at least in part, by adding a trace data offload architecture to the design. For example, a data processing system may process the user's design through design flow 500 of FIG. 5. A selected trace data offload architecture as illustrated in FIG. 7 is included or added to the user's design.

In block 1204, one or more selected tiles of DP array 202 that are used by the design (e.g., active tiles) as implemented in the target IC are configured to generate trace data. The configuration of the selected tiles may be based on user-specified runtime settings for performing trace.

In one aspect, the user-specified runtime settings may be provided during compilation and included in the design as compiled (e.g., within package files 516). In another aspect, the user-specified runtime settings may be provided to the selected tiles subsequent to implementation of the user's design in DP array 202, e.g., at runtime, and prior to execution of the design. In one aspect, the user-specified runtime settings may be provided to runtime program code executing in PS 206 by way of a Secure Socket Shell (SSH) via Ethernet, a terminal window TTY (teletype or virtual teletype) session over a serial port, or the like. The user specified settings may be provided via a command line interface (or other user interface) that allows the user to access the PS 206 and the operating system also executing on PS 206. The runtime may generate configuration data from the user-specified runtime settings provided thereto and write the configuration data to configuration registers 406 of the selected tiles. In another aspect, the user-specified runtime settings may be processed by scripts executing in data processing system 102 at runtime of the user's design as implemented in DP array 202 and provided to DP array 202 by way of the hardware server in IC 150 prior to execution of the user's design.

In block 1206, during execution of the design by the DP array, trace data as generated by the one or more selected tiles of the DP array is conveyed to a memory using, at least in part, the trace data offload architecture. The memory may be an HCB 212 of IC 150 or volatile memory 160. In block 1208, data processing system 102, which is coupled to IC 150, generates a trace report from the trace data. In general, the trace report provides and/or visualizes details of the trace data (e.g., hardware events) including function calls/returns, various types of stalls, DMA circuit activity, and/or interface activity. The trace data may be specified on a per tile basis, per graph basis, per kernel basis, or the like.

Figure 13:
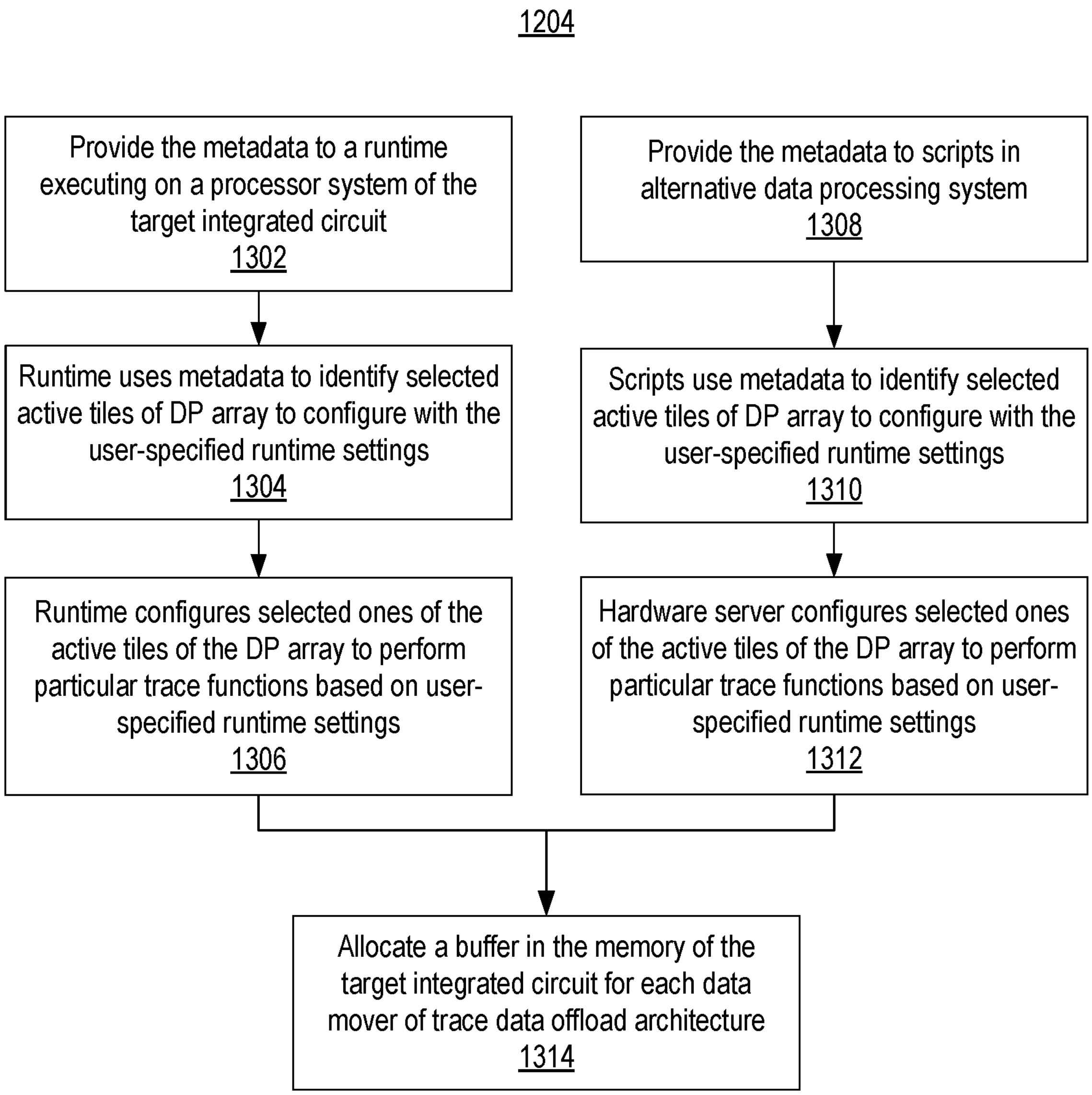
FIG. 13 illustrates an example implementation of block 1204 of FIG. 12.

FIG. 13 illustrates an example implementation of block 1204 of FIG. 12. The example of FIG. 13 illustrates two alternative implementations. In one example, the flow follows blocks 1302, 1304, and 1306 to block 1314. This implementation corresponds to the case in which runtime program code is executing in a processing unit of PS 206. The runtime program code may execute concurrently with the user's design in DP array 202. The runtime program code is capable of controlling operation of the user's design in DP array 202 as well as certain trace functionality such as various functions and/or operations described herein as being configurable at runtime of the user design (as compared to those that are compilation based).

In block 1302, the metadata generated during design flow 500 is provided to the runtime executing on PS 206 of IC 150. In block 1304, the runtime uses the metadata to identify selected ones of the active tiles of DP array 202 to configure based on the user-specified runtime settings. As noted, the metadata specifies correlations between different portions of the design and different tiles of DP array 202 used by the design. The user-specified runtime settings define how and/or when trace is to be performed. For example, the runtime settings may specify trace start conditions, trace stop conditions, the particular active tiles of the DP array that are to be generating trace data, the particular hardware events that are to be detected in each respective active tile that is enabled for trace, counter initialization and configuration settings, particular graphs to perform trace, etc.

In block 1306, the runtime program code configures selected ones of the active tiles of the DP array to perform particular trace functions based on the user-specified runtime settings. For example, the runtime is capable of writing to the configuration registers 406 of the respective ones of the active tiles to configure trace functionality. In performing block 1306, it should be appreciated that a set of user-specified runtime settings may be specified as part of the user's design that is loaded into DP array 202. In other examples, the user may provide the user-specified runtime settings to the runtime program code executing in the target IC at runtime of the user's design in DP array 202. In that case, the runtime parses the received user-specified runtime settings to generate the configuration data used to configure the selected ones of the active tiles for performing trace.

In another example, the flow follows blocks 1308, 1310, and 1312 to block 1314. This implementation corresponds to the case in which a computer system (e.g., data processing system 102) is coupled to accelerator 130 via a physical connection such as a JTAG (Joint Test Action Group) port, a serial connection, Ethernet, etc. In this example, accelerator 130 is not a peripheral device of data processing system 102 in that accelerator 130 is not connected by way of a bus of data processing system 102. In this case, data processing system 102 may interact with IC 150 by way of the hardware server implemented in IC 150 (e.g., a separate hardware/software component). In this example, data processing system 102 is executing one or more scripts that are capable of performing functions attributed to the runtime program code in terms of generating configuration data for DP array 202 and configuring tiles of DP array 202.

In block 1308, the metadata generated during design flow 500 is provided to the scripts executing on data processing system 102. In block 1310, the scripts use the metadata to identify selected ones of the active tiles of DP array 202 to configure based on the user-specified runtime settings. In block 1312, the scripts provide configuration data to IC 150 by way of the hardware server. The scripts, operating through the hardware server, are capable of writing to the configuration registers 406 of the respective ones of the active tiles to configure trace functionality.

For purposes of illustration, consider the following scenario. The scripts are capable of parsing a received user command. Listing 3 shows an example of a command line command that provides user-specified runtime settings.

Listing 3

```
aietrace start -link-summary foo.summary -base-address 0x900000000
-depth 0x1000000 -work-dir Work -graphs mygraph -config-level
functions_all_stalls
```

In the example of Listing 3, the user command provides user-specified runtime settings such as a base address for creating buffers in memory, the particular graphs (e.g., combinations of kernels) to be traced, and the particular hardware events to be detected (e.g., stalls). The scripts parse the command and initialize the relevant or selected active tiles by cross referencing the noted graphs and/or functions with the metadata to determine which active tiles are to be configured. The scripts may perform operations such as writing configuration data specifying the trace events to be detected to the configuration registers 406, writing to counters 408, setting trace start and/or trace stop conditions, and establishing or configuring buffers in memory for storing trace data for offload to the data processing system 102. The scripts wait until the user's design completes execution. In response to the design completing execution, a trace stop function of the scripts may be executed. The scripts are capable of reading the buffers from memory and writing the trace data to memory of data processing system 102 as files to be analyzed for performing the trace analysis.

It should be appreciated that the particular operations described as being performed by the scripts executing in data processing system 102 may also be performed by the runtime program code as executed in PS 206 of IC 150 at runtime of the user's design in DP array 202. The runtime program code may perform similar functionality in that the runtime may parse received user commands, configure DP array 202 as described, allocate buffers, and move the trace data from the buffers into files stored in memory of data processing system 102.

In block 1314, buffers are allocated in memory. The buffers may be allocated by the runtime program code or the scripts depending on the particular implementation of trace being performed.

The user may interact with the runtime program code executing in PS 206 or the scripts executing in data processing system 102 to provide updated user-specified runtime settings. This allows a user to reconfigure trace functionality for the user's design in DP array 202 in real-time. Aspects of trace that may be changed include, but are not limited to, which active tiles are configured to generate trace data in executing the user's design, which trace events are detected, and/or the start and/or stop conditions for performing trace as described herein, and/or the size of buffers allocated in memory.

Figure 14:
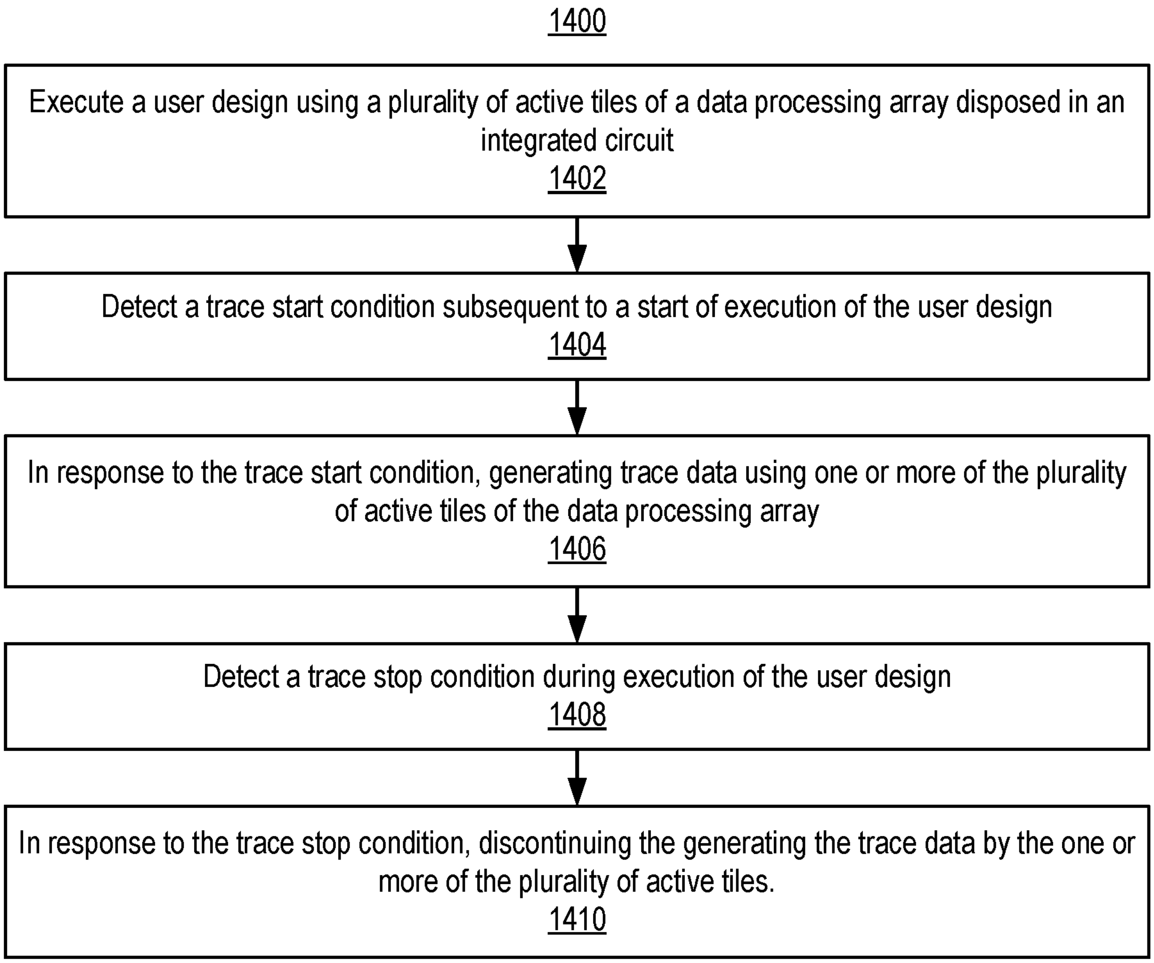
FIG. 14 illustrates an example method of performing trace for a data processing array of an integrated circuit.

FIG. 14 illustrates an example method 1400 of performing trace for a data processing array of an IC. Method 1400 may begin in a state where the user design has been implemented (e.g., compiled) and loaded into IC 150 for execution. In block 1402, the user design is executed using a plurality of active tiles of DP array 202 in IC 150. In block 1404, a trace start condition is detected subsequent to start of execution of the user design. In block 1406, in response to the trace start condition, trace data is generated using one or more of the plurality of active tiles of DP array 202 (e.g., those tiles configured for performing trace). In block 1408, a trace stop condition is detected during execution of the user design. In block 1410, in response to the trace stop condition, the one or more active tiles generating trace data discontinue or stop generating trace data.

Figure 15A:
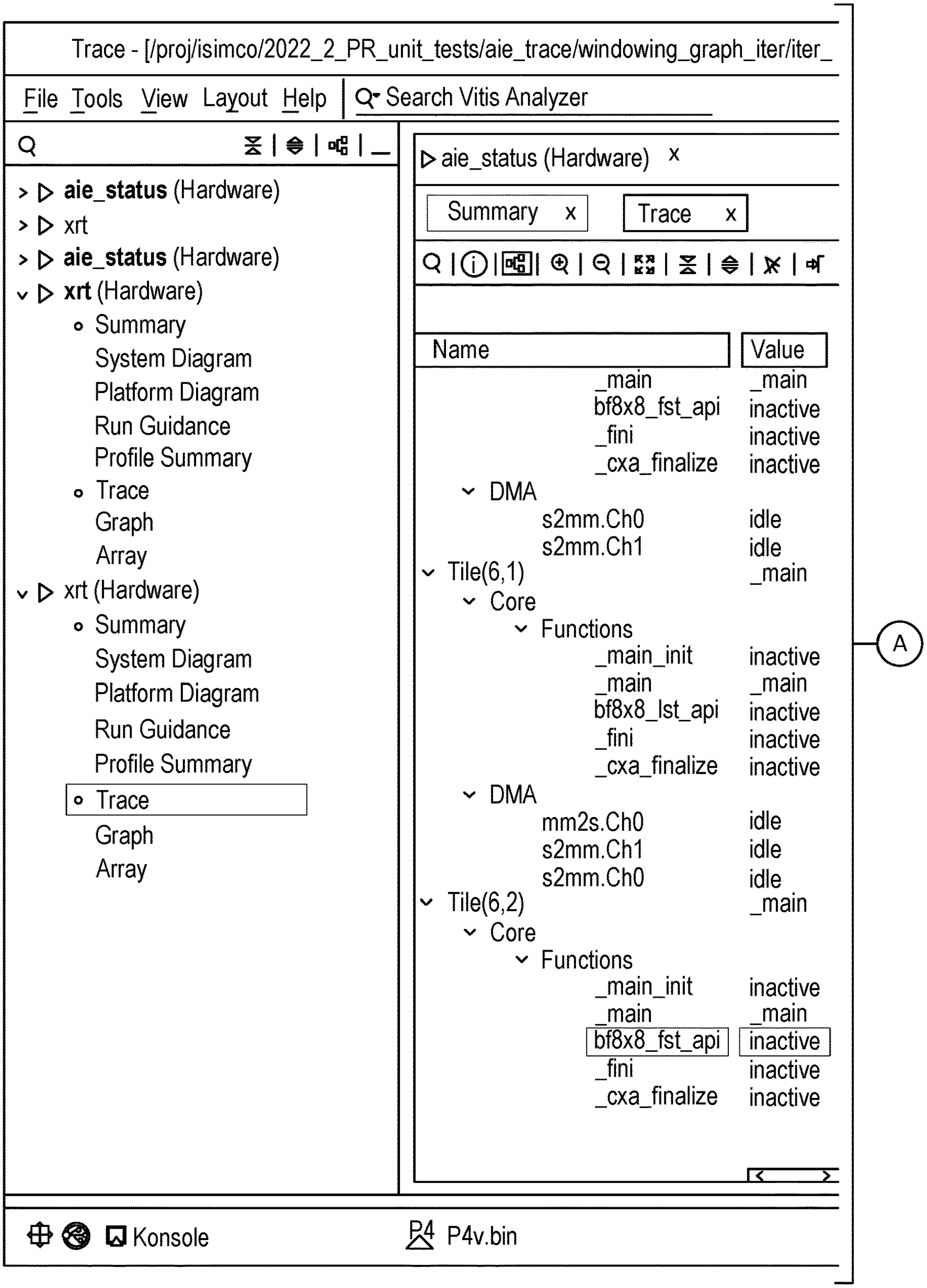
FIGS. 15A, 15B, and 15C, taken collectively, illustrate an example trace report that may be generated by a data processing system.
Figure 15B:
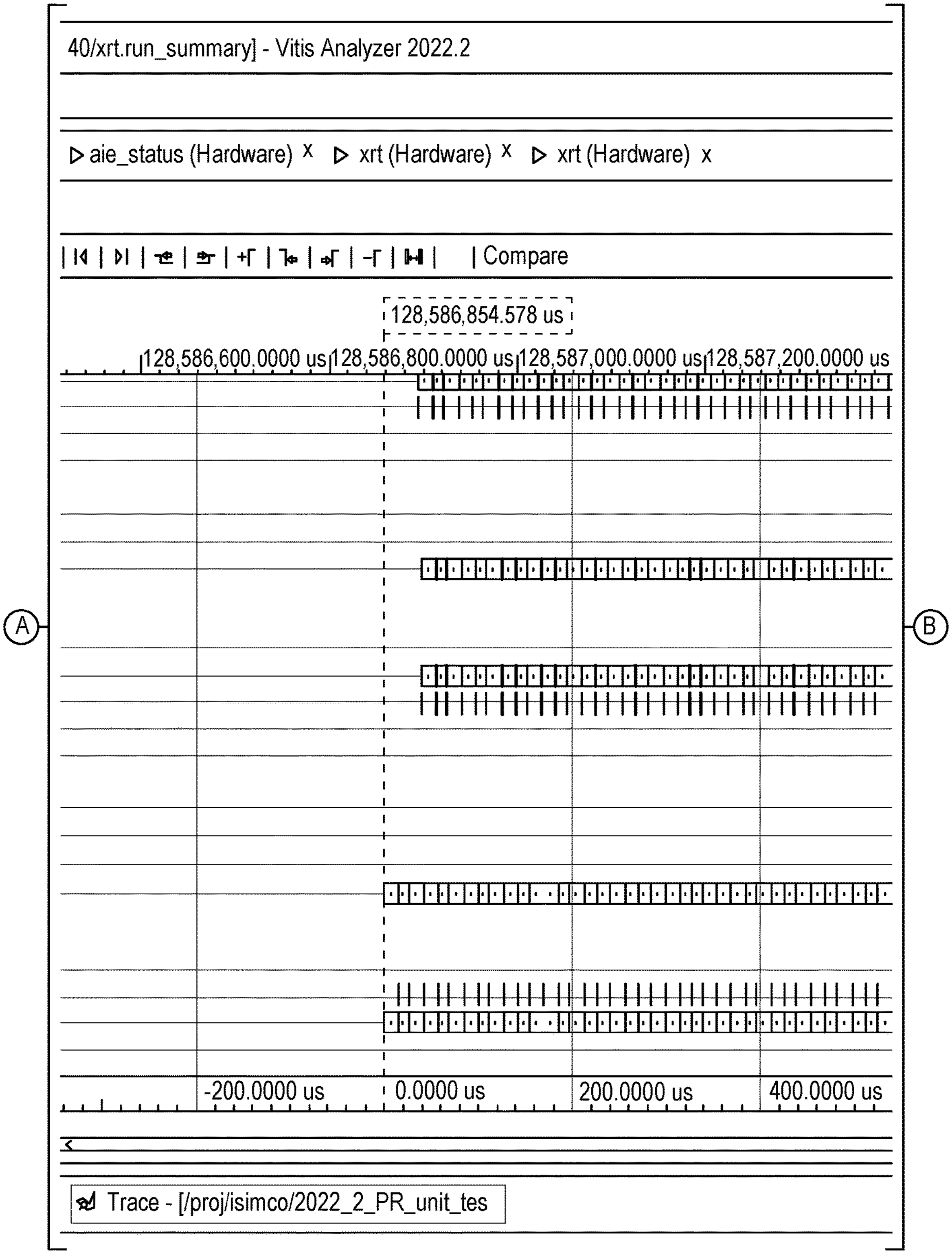
Figure 15C:
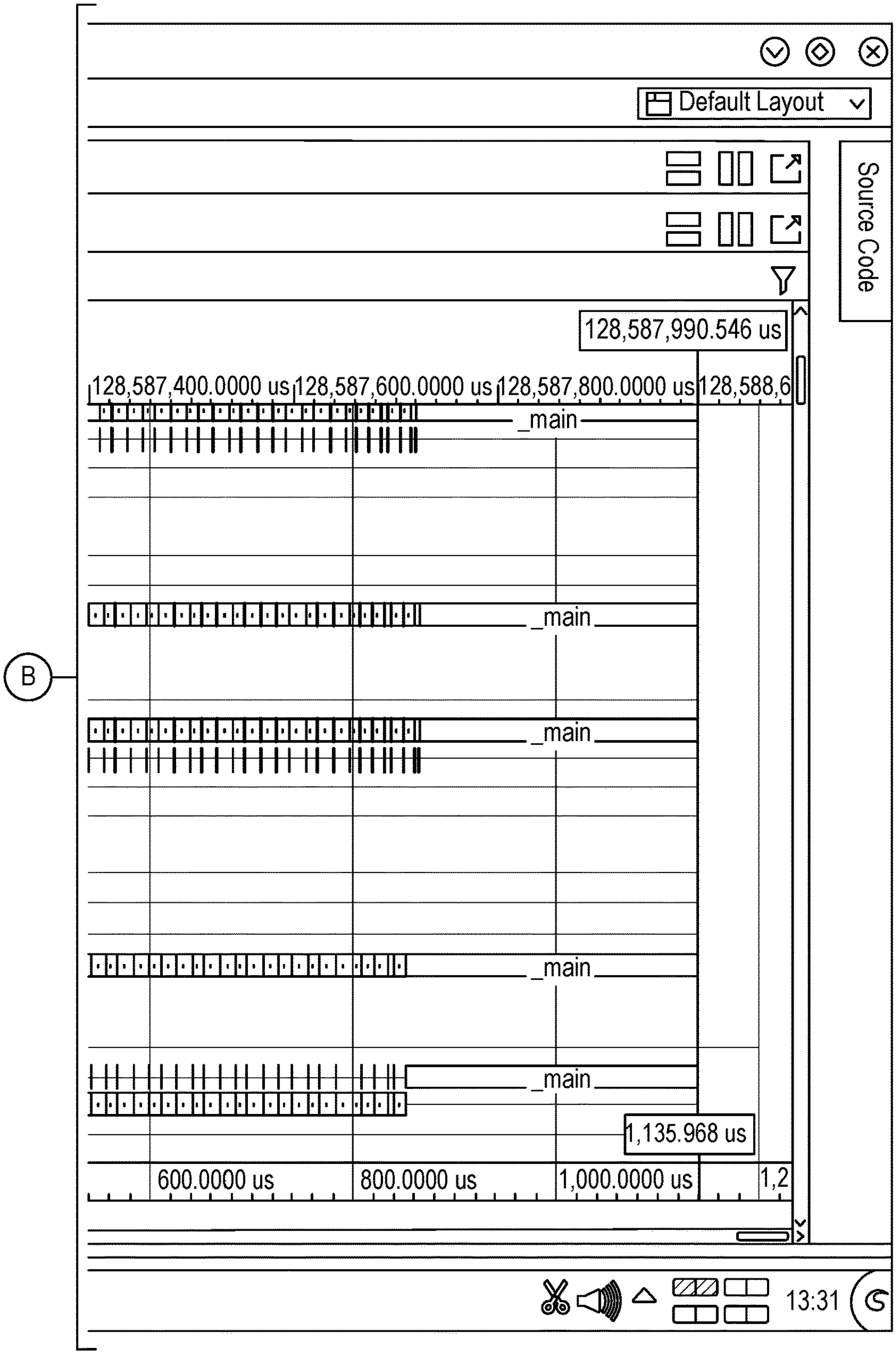

FIGS. 15A, 15B, and 15C, taken collectively, illustrate an example trace report that may be generated by a data processing system. In the example of FIG. 15, the trace report provides is capable of providing trace-based guidance that details operations occurring in PS 206 and/or a visualization of activity occurring in DP array 202 in executing the user's design. The trace events (e.g., trace data) are illustrated as the blocks placed along the timeline in different rows while the particular meaning of the rows as specified by the information of the tree hierarchy on the left of each trace report is obtained from the metadata (e.g., tiles, graphs, kernels, functions, etc.).

In the example of FIG. 15, the trace data is placed on the timeline at the actual start time of trace whether the trace start condition specified clock cycles, regular time (e.g., seconds), iterations of a graph, a user-specified trace event (e.g., inserted into the user design as compiled), or a hardware trace event. As illustrated, the trace date begins at a time corresponding to the start of trace rather than at the start of execution of the user design as illustrated in FIG. 15B. The analysis of the windowed trace data performed by data processing system 102 provides an accurate visualization despite the partial trace data received from DP array 202.

As part of generating the trace report, data processing system 102 is capable of determining a context (e.g., a particular function) that started executing or was executing at the time that trace started. The trace report generated keeps the trace data synchronized with the windowing defined by the trace start condition and the trace stop condition. Data processing system 102 determines the appropriate visualization of the trace data based on the windowed trace that is captured. For example, trace data for a given tile may start in the middle of a particular function being executed. As such, the function call or start event corresponding to the executing function was not captured by the start of trace. Certain hardware events relating to execution of the function such as stalls, for example, still may be captured by the trace (e.g., the events occur after the start of trace). The return or end of the function also may be captured.

In one or more example implementations, data processing system 102, using the user-specified runtime settings and the metadata for the user design as compiled may use a default function (e.g., main) as the context. In another example, the data processing system may pause or delay the rendering of trace data (e.g., the visualization of the trace data) until such time that a return or end of a function is detected. The function that ended or returned may be used as the starting context for displaying the trace data. In that case, data processing system 102 may continue (or start in this example) rendering data using the detected function as the starting context. By using the function as a starting context, data processing system 102 attributes those hardware events detected at the start of trace while the function is unknown (prior to the start of another function) to the function that returned or ended. In another example, data processing system 102 may discard events that occur after the start of trace that are not associated with a particular function. In one or more example implementations, the particular manner in which data processing system 102 determines context (e.g., using a default context, using a returning or ending function, or discarding unassociated trace events) may be specified by the user as a preference.

For purposes of illustration, consider the example program code of Listing 4 below.

Listing 4

```
...
___attribute___((noinline))
voice kernel_w_2048_2(input_window_cint16 * in1,
input_window_cint16 * in2, output_window_cint16 * out)
{
  for (unsigned i=0; i<2048; i++)
  {
    if (i==10)
      event0( );
    _kernel_w_2048_2(in1, in2, out);
  }
}
...
```

In the example, the event that starts trace is inserted within a particular flow control construct of the user design. In the example of Listing 4, the event generation statement is incorporated into a "for" loop. The inclusion of the event generation statement as illustrated helps to provide added context for trace defining the particular circumstances under which the event is generated. In the example, calling event0 triggers the start of trace, which occurs every $10^{th}$ iteration of the loop. This may be implemented in a specific tile of DP array 202.

Since trace may be started in the middle of execution of a function (e.g., the kernel_w_2048_2 function), the particular function that is executing when trace starts is unknown. In the example of Listing 3, including the additional function _kerne_w_2048_2 provides context by indicating the particular function that is executing when trace is initiated. In particular, while an event for the start of kernel_w_2048_2 is not detected, an event for the start of _kernel_w_2048_2 is detected. The naming convention (e.g., removing the leading underscore) indicates the particular function that was executing at the start of trace.

The terminology used herein is for the purpose of describing particular embodiments only and is not intended to be limiting. Notwithstanding, several definitions that apply throughout this document are expressly defined as follows.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention.

As defined herein, the term "computer-readable storage medium" means a storage medium that contains or stores program instructions for use by or in connection with an instruction execution system, apparatus, or device. As defined herein, a "computer-readable storage medium" is not a transitory, propagating signal per se. The various forms of memory, as described herein, are examples of computer-readable storage media. A non-exhaustive list of examples of computer-readable storage media include an electronic storage device, a magnetic storage device, an optical storage device, an electromagnetic storage device, a semiconductor storage device, or any suitable combination of the foregoing. A non-exhaustive list of more specific examples of a computer-readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, "data processing system" means one or more hardware systems configured to process data, each hardware system including at least one hardware processor programmed to initiate operations and memory.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "user" refers to a human being.

As defined herein, the terms "one embodiment," "an embodiment," "in one or more embodiments," "in particular embodiments," or similar language mean that a particular feature, structure, or characteristic described in connection with the embodiment is included in at least one embodiment described within this disclosure. Thus, appearances of the aforementioned phrases and/or similar language throughout this disclosure may, but do not necessarily, all refer to the same embodiment.

As defined herein, the term "real-time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc., may be used herein to describe various elements. These elements should not be limited by these terms, as these terms are only used to distinguish one element from another unless stated otherwise or the context clearly indicates otherwise.

A computer program product may include a computer-readable storage medium (or media) having computer-readable program instructions thereon for causing a processor to carry out aspects of the inventive arrangements described herein. Within this disclosure, the term "program code" is used interchangeably with the term "program instructions." Computer-readable program instructions described herein may be downloaded to respective computing/processing devices from a computer-readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer-readable program instructions may include state-setting data. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer-readable program instructions by utilizing state information of the computer-readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer-readable program instructions, e.g., program code.

These computer-readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the operations specified in the flowchart and/or block diagram block or blocks.

The computer-readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:

executing a user design using a plurality of active tiles of a data processing array disposed in an integrated circuit;

detecting a trace start condition subsequent to a start of execution of the user design by the plurality of active tiles;

in response to the trace start condition, generating trace data using one or more of the plurality of active tiles of the data processing array during execution of the user design;

detecting a trace stop condition during execution of the user design by the plurality of active tiles;

in response to the trace stop condition, discontinuing the generating the trace data by the one or more of the plurality of active tiles;

receiving, by a subsystem of the integrated circuit separate from the data processing array and during execution of the user design, a user command from a system external to the integrated circuit; and modifying, by the subsystem and in response to the user command, trace functionality of one or more of the plurality of active tiles by writing to a configuration register of the one or more of the plurality of active tiles, wherein the external system is unable to directly access the configuration register.

2. The method of claim 1, wherein at least one of the trace start condition or the trace stop condition is broadcast from a first tile of the plurality of active tiles to a second tile of the plurality of active tiles, wherein the trace start condition or the trace stop condition, as received by the second tile, controls trace functionality in the second tile.

3. The method of claim 1, wherein at least one of the trace start condition or the trace stop condition is broadcast from a first portion of a first tile of the plurality of active tiles to a second portion of the first tile, wherein the trace start condition or the trace stop condition, as received by the second portion of the first tile, controls trace functionality in the second portion of the first tile.

4. The method of claim 1, wherein two or more active tiles of the plurality of active tiles use at least one of a different trace start condition or a different trace stop condition.

5. The method of claim 1, wherein at least one of the trace start condition or the trace stop condition is specified by a user as a time after the start of execution of the user design.

6. The method of claim 1, wherein at least one of the trace start condition or the trace stop condition is specified by a user as a number of execution iterations of a graph of the user design.

7. The method of claim 1, wherein at least one of the trace start condition or the trace stop condition is specified by a user as a user-event inserted into program code of the user design.

8. The method of claim 1, wherein at least one of the trace start condition or the trace stop condition is specified by a user as a hardware event.

9. The method of claim 1, further comprising:

incrementing a first counter of a plurality of counters in the one or more active tiles in response to clock cycles of the data processing array;

incrementing a second counter of the plurality of counters in response to the first counter reaching a predetermined first counter value; and detecting at least one of the trace start condition or the trace stop condition in response to the second counter reaching a predetermined second counter value.

10. The method of claim 1, further comprising:

receiving the trace data in a data processing system;

delaying writing of the trace data until a return of a function of the user design is detected; and using the function that returned as a starting context of a trace report of the trace data.

11. An integrated circuit, comprising:

a data processing array including a plurality of active tiles configured to execute a user design;

wherein each active tile of the plurality of active tiles includes trace circuitry and the trace circuitry of one or more of the plurality of active tiles is configured to perform trace operations during execution of the user design including:

detecting a trace start condition subsequent to a start of execution of the user design by the plurality of active tiles;

in response to the trace start condition, generating trace data using one or more of the plurality of active tiles of the data processing array during execution of the user design;

detecting a trace stop condition during the execution of the user design by the plurality of active tiles; and in response to the trace stop condition, discontinuing the generating the trace data by the one or more of the plurality of active tiles;

wherein a trace event including the trace start condition or a trace end condition detected in a first tile of the plurality of active tiles is broadcast to a second tile of the plurality of active tiles and, in response to receiving the trace event in the second tile, trace functionality in the second tile is started or stopped.

12. The integrated circuit of claim 11, further comprising:

a subsystem that is separate from the data processing array, wherein the subsystem is configured to receive, during execution of the user design, a user command from an external system external to the integrated circuit and, in response to the user command, modify trace functionality of one or more of the plurality of active tiles by writing to a configuration register of the one or more of the plurality of active tiles, wherein the external system is unable to directly access the configuration register.

13. The integrated circuit of claim 11, wherein the trace event is broadcast from a first portion of a first tile of the plurality of active tiles to a second portion of the first tile, wherein the trace event, as received by the second portion of the first tile, controls trace functionality in the second portion of the first tile.

14. The integrated circuit of claim 11, wherein two or more active tiles of the plurality of active tiles use at least one of different trace start conditions or different trace stop conditions.

15. The integrated circuit of claim 11, wherein the trace event is specified by a user as a time after the start of execution of the user design.

16. The integrated circuit of claim 11, wherein the trace event is specified by a user as a number of execution iterations of a graph of the user design.

17. The integrated circuit of claim 11, wherein the trace event is specified by a user as a user-event inserted into program code of the user design.

18. The integrated circuit of claim 11, wherein the trace event is specified by a user as a hardware event.

19. The integrated circuit of claim 11, wherein the trace circuitry of the one or more active tiles of the plurality of active tiles includes a plurality of counters including a first counter and a second counter;

wherein the first counter is configured to increment in response to clock cycles of the data processing array;

wherein the second counter is configured to increment in response to the first counter reaching a predetermined first counter value; and wherein the trace event is detected in response to the second counter reaching a predetermined second counter value.

20. A system, comprising:

an integrated circuit having a data processing array, wherein the data processing array includes a plurality of active tiles configured to execute a user design;

wherein each active tile of the plurality of active tiles includes trace circuitry and the trace circuitry of one or more of the plurality of active tiles is configured to perform trace operations including:

detecting a trace start condition subsequent to a start of execution of the user design;

in response to the trace start condition, generating trace data using one or more of the plurality of active tiles of the data processing array;

detecting a trace stop condition during the execution of the user design; and in response to the trace stop condition, discontinuing the generating the trace data by the one or more of the plurality of active tiles;

wherein the trace circuitry of the one or more active tiles of the plurality of active tiles includes a first counter and a second counter, wherein the first counter is configured to increment in response to clock cycles of the data processing array and the second counter is configured to increment in response to the first counter reaching a predetermined first counter value, and wherein at least one of the trace start condition or the trace stop condition is detected in response to the second counter reaching a predetermined second counter value.

* * * * *